(12) United States Patent
Yang et al.

(10) Patent No.: US 11,637,205 B2
(45) Date of Patent: Apr. 25, 2023

(54) SEMICONDUCTOR DEVICE

(71) Applicant: SAMSUNG ELECTRONICS CO., LTD., Suwon-si (KR)

(72) Inventors: Junggil Yang, Hwaseong-si (KR);
Seungmin Song, Hwaseong-si (KR);
Geumjong Bae, Suwon-si (KR); Dong Il Bae, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 292 days.

(21) Appl. No.: 17/140,786

(22) Filed: Jan. 4, 2021

(65) Prior Publication Data
US 2021/0135001 A1 May 6, 2021

Related U.S. Application Data

(63) Continuation of application No. 16/894,270, filed on Jun. 5, 2020, now Pat. No. 10,916,658, which is a
(Continued)

(30) Foreign Application Priority Data

Nov. 30, 2017 (KR) .................. 10-2017-0163358

(51) Int. Cl.
*H01L 29/78* (2006.01)
*H01L 29/423* (2006.01)
(Continued)

(52) U.S. Cl.
CPC ...... *H01L 29/785* (2013.01); *H01L 29/41775* (2013.01); *H01L 29/42356* (2013.01);
(Continued)

(58) Field of Classification Search
CPC ..... H01L 21/823821; H01L 21/823807; H01L 21/823431; H01L 29/785; H01L 29/42356;
(Continued)

(56) References Cited

U.S. PATENT DOCUMENTS 5,965,914 A 10/1999 Miyamoto
7,253,060 B2 8/2007 Yun et al.
(Continued)

FOREIGN PATENT DOCUMENTS

JP 2011-029503 A 2/2011
KR 10-2015-0033496 A 4/2015
(Continued)

*Primary Examiner* — Jaehwan Oh
*Assistant Examiner* — John M Parker
(74) *Attorney, Agent, or Firm* — Sughrue Mion, PLLC

(57) ABSTRACT

A semiconductor device includes a channel pattern including a first semiconductor pattern and a second semiconductor pattern, which are sequentially stacked on a substrate, and a gate electrode that extends in a first direction and crosses the channel pattern. The gate electrode includes a first portion interposed between the substrate and the first semiconductor pattern and a second portion interposed between the first and second semiconductor patterns. A maximum width in a second direction of the first portion is greater than a maximum width in the second direction of the second portion, and a maximum length in the second direction of the second semiconductor pattern is less than a maximum length in the second direction of the first semiconductor pattern.

20 Claims, 29 Drawing Sheets

Related U.S. Application Data continuation of application No. 16/011,785, filed on Jun. 19, 2018, now Pat. No. 10,714,617.

(51) Int. Cl.
*H01L 29/417* (2006.01)
*H01L 29/66* (2006.01)
*H01L 29/786* (2006.01)

(52) U.S. Cl.
CPC .. *H01L 29/42392* (2013.01); *H01L 29/66545* (2013.01); *H01L 29/66772* (2013.01); *H01L 29/66795* (2013.01); *H01L 29/7845* (2013.01); *H01L 29/78618* (2013.01); *H01L 29/78654* (2013.01); *H01L 29/78696* (2013.01); *H01L 29/7848* (2013.01); *H01L 2029/7858* (2013.01)

(58) Field of Classification Search
CPC ......... H01L 29/42392; H01L 29/66545; H01L 27/0924; H01L 28/24; H01L 23/528
See application file for complete search history.

(56) References Cited

U.S. PATENT DOCUMENTS

| | | |
|---|---|---|
| 7,402,483 B2 | 7/2008 | Yun et al. |
| 8,022,439 B2 | 9/2011 | Kajiyama |
| 8,399,879 B2 | 3/2013 | Liu et al. |
| 8,829,625 B2 | 9/2014 | Sleight et al. |
| 8,987,794 B2 | 3/2015 | Rachmady et al. |
| 9,362,354 B1 | 6/2016 | Chang et al. |
| 9,412,816 B2 | 8/2016 | Yang et al. |
| 9,502,518 B2 | 11/2016 | Liu et al. |
| 9,614,068 B2 | 4/2017 | Seo |
| 10,522,682 B2 * | 12/2019 | Yoon ................... H01L 27/0924 |
| 10,763,368 B2 | 9/2020 | Chiang et al. |
| 11,387,236 B2 * | 7/2022 | Park ................... H01L 29/0673 |
| 2013/0341704 A1 | 12/2013 | Rachmady et al. |
| 2014/0225065 A1 | 8/2014 | Rachmady et al. |
| 2017/0062598 A1 | 3/2017 | Seo |

FOREIGN PATENT DOCUMENTS

| | | |
|---|---|---|
| KR | 10-2016-0099445 A | 8/2016 |
| KR | 10-2017-0027639 A | 3/2017 |

* cited by examiner

SEMICONDUCTOR DEVICE

CROSS-REFERENCE TO RELATED APPLICATIONS

This application is a continuation of U.S. patent application Ser. No. 16/894,270, filed on Jun. 5, 2020, which is a continuation of U.S. patent application Ser. No. 16/011,785, filed on Jun. 19, 2018, in the U.S. Patent and Trademark Office, which claims priority under 35 U.S.C. § 119 to Korean Patent Application No. 10-2017-0163358, filed on Nov. 30, 2017, in the Korean Intellectual Property Office, the entire contents of which are hereby incorporated by reference.

FIELD

The present disclosure relates to a semiconductor device, and in particular, to a semiconductor device including a gate-all-around type transistor.

BACKGROUND

Due to their small-sized, multifunctional, and/or low-cost characteristics, semiconductor devices are being esteemed as important elements in the electronic industry. The semiconductor devices may be classified into a memory device for storing data, a logic device for processing data, and a hybrid device including both of memory and logic elements. To meet the increased demand for electronic devices with fast speed and/or low power consumption, it is necessary to realize semiconductor devices with high reliability, high performance, and/or multiple functions. To satisfy these technical requirements, complexity and/or integration density of semiconductor devices are being increased.

SUMMARY

Some embodiments of the inventive concept provide a semiconductor device, in which gate-all-around type transistors with improved electric characteristics are provided.

According to some embodiments of the inventive concept, a semiconductor device may include a channel pattern including a first semiconductor pattern and a second semiconductor pattern, which are sequentially stacked on a substrate, and a gate electrode including a first portion interposed between the substrate and the first semiconductor pattern, and a second portion interposed between the first semiconductor pattern and the second semiconductor pattern, wherein the gate electrode extends in a first direction and crosses the channel pattern, wherein the first portion of the gate electrode has a maximum width in a second direction that is greater than a maximum width in the second direction of the second portion of the gate electrode, and wherein a maximum length in the second direction of the second semiconductor pattern is less than a maximum length in the second direction of the first semiconductor pattern.

According to some embodiments of the inventive concept, a semiconductor device may include a channel pattern including a first semiconductor pattern and a second semiconductor pattern sequentially stacked on a substrate, a pair of source/drain patterns on the substrate, the first and second semiconductor patterns of the channel pattern being interposed between the pair of source/drain patterns, and a gate electrode including a first portion interposed between the substrate and the first semiconductor pattern, wherein the gate electrode extends in a first direction and crosses the channel pattern, wherein the first portion of the gate electrode has a width in a second direction that increases with decreasing distance from the substrate, and wherein each of the pair of source/drain patterns has a width in the second direction that decreases with decreasing distance from the substrate, within a range between the first semiconductor pattern and the substrate.

According to some embodiments of the inventive concept, a semiconductor device may include a first channel pattern and a second channel pattern on a substrate, each of the first and second channel patterns including a first semiconductor pattern and a second semiconductor pattern, which are sequentially stacked on the substrate, a first source/drain pattern and a second source/drain pattern in contact with the first channel pattern and the second channel pattern, respectively, wherein the first source drain pattern and the second source/drain pattern have different conductivity types from each other, and a gate electrode including a first portion interposed between the first semiconductor pattern of the first channel pattern and the substrate, and a second portion interposed between the first semiconductor pattern of the second channel pattern and the substrate, wherein the gate electrode extends in a first direction and crosses the first and second channel patterns, and wherein the first portion of the gate electrode has a maximum width in a second direction that is greater than a maximum width in the second direction of the second portion of the gate electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
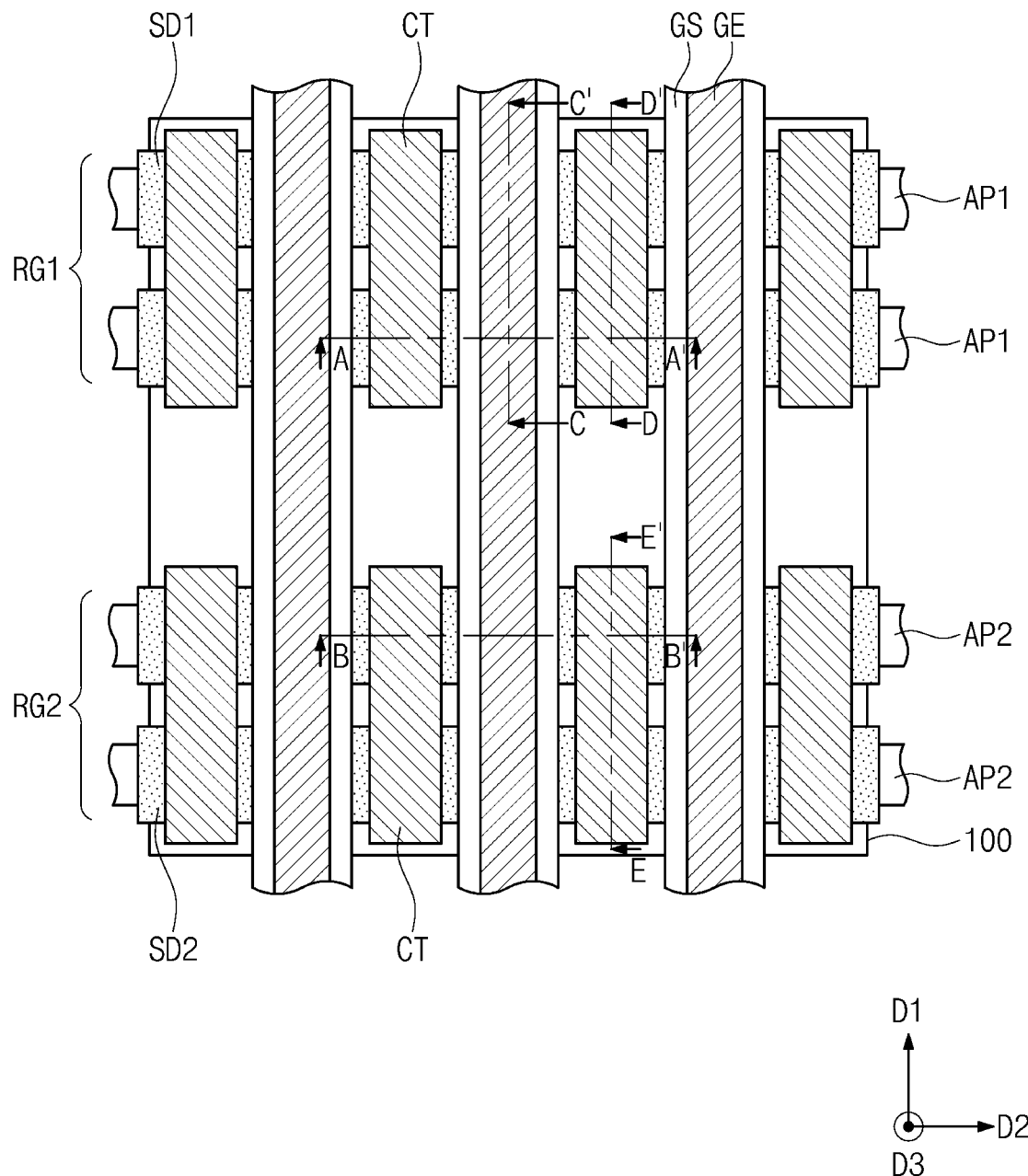
FIG. 1 is a plan view illustrating a semiconductor device according to some embodiments of the inventive concept.

FIG. 1 is a plan view illustrating a semiconductor device according to some embodiments of the inventive concept. FIGS. 2A to 2E are sectional views taken along lines A-A', B-B', C-C', D-D', and E-E', respectively, of FIG. 1.

Referring to FIGS. 1 and 2A to 2E, a substrate 100 including a first region RG1 and a second region RG2 may be provided. The substrate 100 may be a semiconductor substrate. In some embodiments, the substrate 100 may be a silicon substrate, a germanium substrate, or a silicon-on-insulator (SOI) substrate. First transistors may be provided on the first region RG1 of the substrate 100, and second transistors may be provided on the second region RG2 of the substrate 100.

The first and second regions RG1 and RG2 of the substrate 100 may be a memory cell region, on which a plurality of memory cells for storing data are provided. As an example, memory cell transistors constituting a plurality of SRAM cells may be provided on the memory cell region of the substrate 100. The first and second transistors may be used as a part of the memory cell transistors.

The first and second regions RG1 and RG2 of the substrate 100 may be a logic cell region, on which logic transistors constituting a logic circuit of a semiconductor device are integrated. As an example, logic transistors constituting a processor core or I/O terminals may be provided on the logic cell region of the substrate 100. The first and second transistors may be used as a part of the logic transistors. However, the inventive concept is not limited thereto.

The first transistors on the first region RG1 and the second transistors on the second region RG2 may have conductivity types different from each other. As an example, the first transistors on the first region RG1 may be PMOSFETs, and the second transistors on the second region RG2 may be NMOSFETs.

A device isolation layer ST may be provided on the substrate 100. The device isolation layer ST may be provided in an upper portion of the substrate 100 to define first and second active patterns AP1 and AP2. The first active patterns AP1 may be provided on the first region RG1. The second active patterns AP2 may be provided on the second region RG2. Each of the first and second active patterns AP1 and AP2 may be a line- or bar-shaped pattern extending in a second direction D2.

The device isolation layer ST may be provided to fill a trench TR between each adjacent pair of the first active patterns AP1. The device isolation layer ST may also be provided to fill the trench TR between each adjacent pair of the second active patterns AP2. A top surface of the device isolation layer ST may be lower than top surfaces of the first and second active patterns AP1 and AP2.

First channel patterns CH1 and first source/drain patterns SD1 may be provided on each of the first active patterns AP1. Each of the first channel patterns CH1 may be interposed between each adjacent pair of the first source/drain patterns SD1. Second channel patterns CH2 and second source/drain patterns SD2 may be provided on each of the second active patterns AP2. Each of the second channel patterns CH2 may be interposed between each adjacent pair of the second source/drain patterns SD2.

Each of the first channel patterns CH1 may include first, second, and third semiconductor patterns SP1, SP2, and SP3, which are sequentially stacked on the substrate 100. The first, second, and third semiconductor patterns SP1, SP2, and SP3 may be spaced apart from each other in a third direction D3 that is perpendicular to a top surface of the substrate 100. The first, second, and third semiconductor patterns SP1, SP2, and SP3 may be overlapped with each other, when viewed in a plan view. Each of the first source/drain patterns SD1 may be in direct contact with one of side surfaces of each of the first, second, and third semiconductor patterns SP1, SP2, and SP3. In other words, the first, second, and third semiconductor patterns SP1, SP2, and SP3 may be provided to connect each adjacent pair of the first source/drain patterns SD1 to each other.

The first, second, and third semiconductor patterns SP1, SP2, and SP3 of the first channel pattern CH1 may have the same thickness or different thicknesses from each other. The first, second, and third semiconductor patterns SP1, SP2, and SP3 of the first channel pattern CH1 may differ from each other in maximum length, when measured in the second direction D2. As an example, the maximum length of the second semiconductor pattern SP2 in the second direction D2 may be a first length L1. A length of each of the first semiconductor pattern SP1 and the third semiconductor pattern SP3 in the second direction D2 may be greater than the first length L1 of the second semiconductor pattern SP2. For example, the maximum length of the first semiconductor pattern SP1 in the second direction D2 may be a second length L2. The second length L2 may be greater than the first length L1.

The first, second, and third semiconductor patterns SP1, SP2, and SP3 may be formed of or include at least one of silicon (Si), germanium (Ge), or silicon-germanium (SiGe). Although the first channel pattern CH1 is illustrated to have the first, second, and third semiconductor patterns SP1, SP2, and SP3, the inventive concept is not limited to the number of the semiconductor patterns.

Each of the second channel patterns CH2 may include the first, second, and third semiconductor patterns SP1, SP2, and SP3, which are sequentially stacked on the substrate 100. In some embodiments, the first, second, and third semiconductor patterns SP1, SP2, and SP3 of the second channel pattern CH2 may be configured to have substantially the same features as those of the first channel pattern CH1.

Each of the first source/drain patterns SD1 may be an epitaxial pattern which is epitaxially grown using the first, second, and third semiconductor patterns SP1, SP2, and SP3 of the first channel pattern CH1 and the first active pattern AP1 as a seed layer. The first source/drain patterns SD1 may be p-type impurity regions. The first source/drain patterns SD1 may be formed of or include a material capable of exerting a compressive strain on the first channel pattern CH1. As an example, the first source/drain patterns SD1 may be formed of or include a semiconductor material (e.g., SiGe) whose lattice constant is greater than that of a semiconductor material of the substrate 100.

Each of the second source/drain patterns SD2 may be an epitaxial pattern which is epitaxially grown using the first, second, and third semiconductor patterns SP1, SP2, and SP3 of the second channel pattern CH2 and the second active pattern AP2 as a seed layer. The second source/drain patterns SD2 may be n-type impurity regions. As an example, the second source/drain patterns SD2 may be formed of or include a semiconductor material whose lattice constant is less than that of the semiconductor material of the substrate 100. Alternatively, the second source/drain patterns SD2 may be formed of or include the semiconductor material (e.g., Si) as that of the substrate 100.

A semiconductor material in the first source/drain pattern SD1 may be different from that in the second source/drain pattern SD2. A cross-sectional shape of the first source/drain pattern SD1 in a first direction D1 and the third direction D3 may be different from that of the second source/drain pattern SD2 in the first direction D1 and the third direction D3 (e.g., see FIGS. 2D and 2E).

Gate electrodes GE may be provided to cross the first and second channel patterns CH1 and CH2 or to extend in the first direction D1. The gate electrodes GE may be spaced apart from each other in the second direction D2. The gate electrodes GE may be overlapped with the first and second channel patterns CH1 and CH2, when viewed in a plan view. As an example, the gate electrode GE may be formed of or include at least one of conductive metal nitrides (e.g., titanium nitride or tantalum nitride) or metallic materials (e.g., titanium, tantalum, tungsten, copper, or aluminum).

The gate electrodes GE may be provided to surround each of the first, second, and third semiconductor patterns SP1, SP2, and SP3 of the first channel pattern CH1. For example, the gate electrode GE may be provided to face or enclose top, bottom, and side surfaces of each of the first, second, and third semiconductor patterns SP1, SP2, and SP3 (e.g., see FIG. 2C). The gate electrode GE may be provided to surround each of the first, second, and third semiconductor patterns SP1, SP2, and SP3 of the second channel pattern CH2. In other words, the first and second transistors according to some embodiments of the inventive concept may be gate-all-around (GAA) field effect transistors.

A pair of gate spacers GS may be provided on both side surfaces of each of the gate electrodes GE. The gate spacers GS may extend along the gate electrode GE or in the first direction D1. Top surfaces of the gate spacers GS may be higher than the top surface of the gate electrode GE. The top surfaces of the gate spacers GS may be coplanar with a top surface of a first interlayered insulating layer 110, which will be described below. The gate spacers GS may be formed of or include at least one of SiCN, SiCON, or SiN. As another example, each of the gate spacers GS may be provided to have a multi-layered structure including at least two of SiCN, SiCON, or SiN.

Each of gate dielectric patterns GI may be interposed between each corresponding pair of the gate electrodes GE and the first and second channel patterns CH1 and CH2. The gate dielectric pattern GI may be provided to enclose each of the first, second, and third semiconductor patterns SP1, SP2, and SP3. The gate dielectric pattern GI may be interposed between the gate electrode GE and each of the first, second, and third semiconductor patterns SP1, SP2, and SP3. The gate dielectric pattern GI may be formed of or include at least one of high-k dielectric materials. For example, the high-k dielectric materials may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

A gate capping pattern CP may be provided on each of the gate electrodes GE. The gate capping pattern CP may extend along the gate electrode GE or in the first direction D1. The gate capping pattern CP may include a material having an etch selectivity with respect to the first interlayered insulating layer 110, which will be described below. For example, the gate capping patterns CP may be formed of or include at least one of SiON, SiCN, SiCON, or SiN.

The first interlayered insulating layer 110 may be provided on the substrate 100. The first interlayered insulating layer 110 may be provided to cover the device isolation layer ST, the gate electrodes GE, and the first and second source/drain patterns SD1 and SD2. A top surface of the first interlayered insulating layer 110 may be substantially coplanar with top surfaces of the gate capping patterns CP. A second interlayered insulating layer 120 may be provided on the first interlayered insulating layer 110. As an example, the first and second interlayered insulating layers 110 and 120 may be formed of or include silicon oxide or silicon oxynitride.

Contacts CT may be provided to penetrate the first and second interlayered insulating layers 110 and 120 and may be connected to the first and second source/drain patterns SD1 and SD2. The contacts CT may be formed of or include at least one of metallic materials (e.g., titanium, tantalum, tungsten, copper, or aluminum).

Figure 2A:
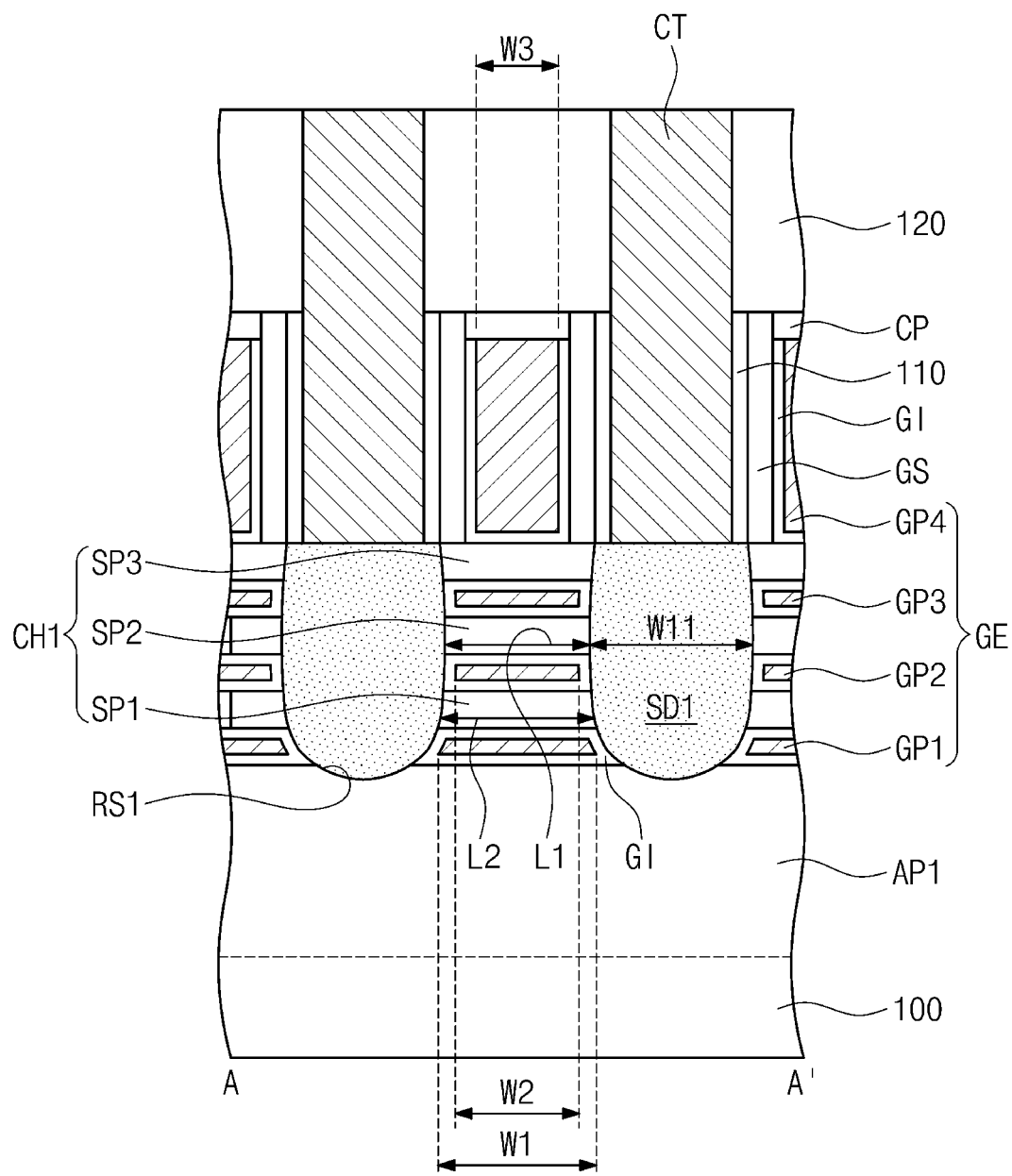
FIGS. 2A to 2E are sectional views taken along lines A-A', B-B', C-C', D-D', and E-E', respectively, of FIG. 1.
Figure 2A:
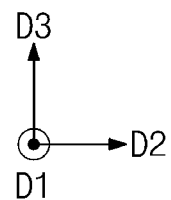

The first transistor on the first region RG1 will be described in more detail with reference to FIG. 2A. The gate electrode GE on the first region RG1 may include first, second, third, and fourth portions GP1, GP2, GP3, and GP4. The first portion GP1 may be interposed between the first active pattern AP1 and the first semiconductor pattern SP1, the second portion GP2 may be interposed between the first semiconductor pattern SP1 and the second semiconductor pattern SP2, the third portion GP3 may be interposed between the second semiconductor pattern SP2 and the third semiconductor pattern SP3, and the fourth portion GP4 may be provided on the third semiconductor pattern SP3.

A width of the first portion GP1 of the gate electrode GE on the first region RG1 in the second direction D2 may increase with decreasing distance from the substrate 100 in the third direction. As an example, a cross-section of the first portion GP1 in the second direction D2 and third direction may have a trapezoidal shape. The maximum width of the first portion GP1 in the second direction D2 may be a first width W1.

A width of each of the second portion GP2 of the gate electrode GE on the first region RG1 and the third portion GP3 of the gate electrode GE on the first region RG1 in the second direction D2 may be less than the first width W1 of the first portion GP1 of the gate electrode GE on the first region RG1. For example, the maximum width of the second portion GP2 in the second direction D2 may be a second width W2. The second width W2 may be less than the first width W1.

A width of the fourth portion GP4 of the gate electrode GE on the first region RG1 in the second direction D2 may be less than the second width W2 of the second portion GP2. For example, the maximum width of the fourth portion GP4 in the second direction D2 may be a third width W3. The third width W3 may be less than the second width W2.

Each of the first source/drain patterns SD1 may be provided to fill a first recess RS1, which is formed in an upper portion of the first active pattern AP1. The first recess RS1 may be defined between adjacent ones of the first channel patterns CH1. A bottom level of the first recess RS1 may be lower than a level of the top surface of the first active pattern AP1.

The maximum width of each of the first source/drain patterns SD1 in the second direction D2 may be an eleventh width W11. A middle portion of the first source/drain pattern SD1 may have the eleventh width W11. The middle portion of the first source/drain pattern SD1 may be located at the same level as that of the second semiconductor pattern SP2. A width of the first source/drain pattern SD1 in the second direction D2 may increase from the top surface to the middle portion. The width of the first source/drain pattern SD1 in the second direction D2 may decrease from the middle portion to the bottom surface.

The gate dielectric patterns GI may be respectively interposed between the first source/drain pattern SD1 and the first, second, and third portions GP1-GP3 of the gate electrode GE on the first region RG1. The gate dielectric patterns GI may be in direct contact with the first source/drain pattern SD1. A lower portion of the first source/drain pattern SD1 may be interposed between each adjacent pair of the first portions GP1. A width of the lower portion of the first source/drain pattern SD1 in the second direction D2 may decrease with decreasing distance from the substrate 100.

Figure 2B:
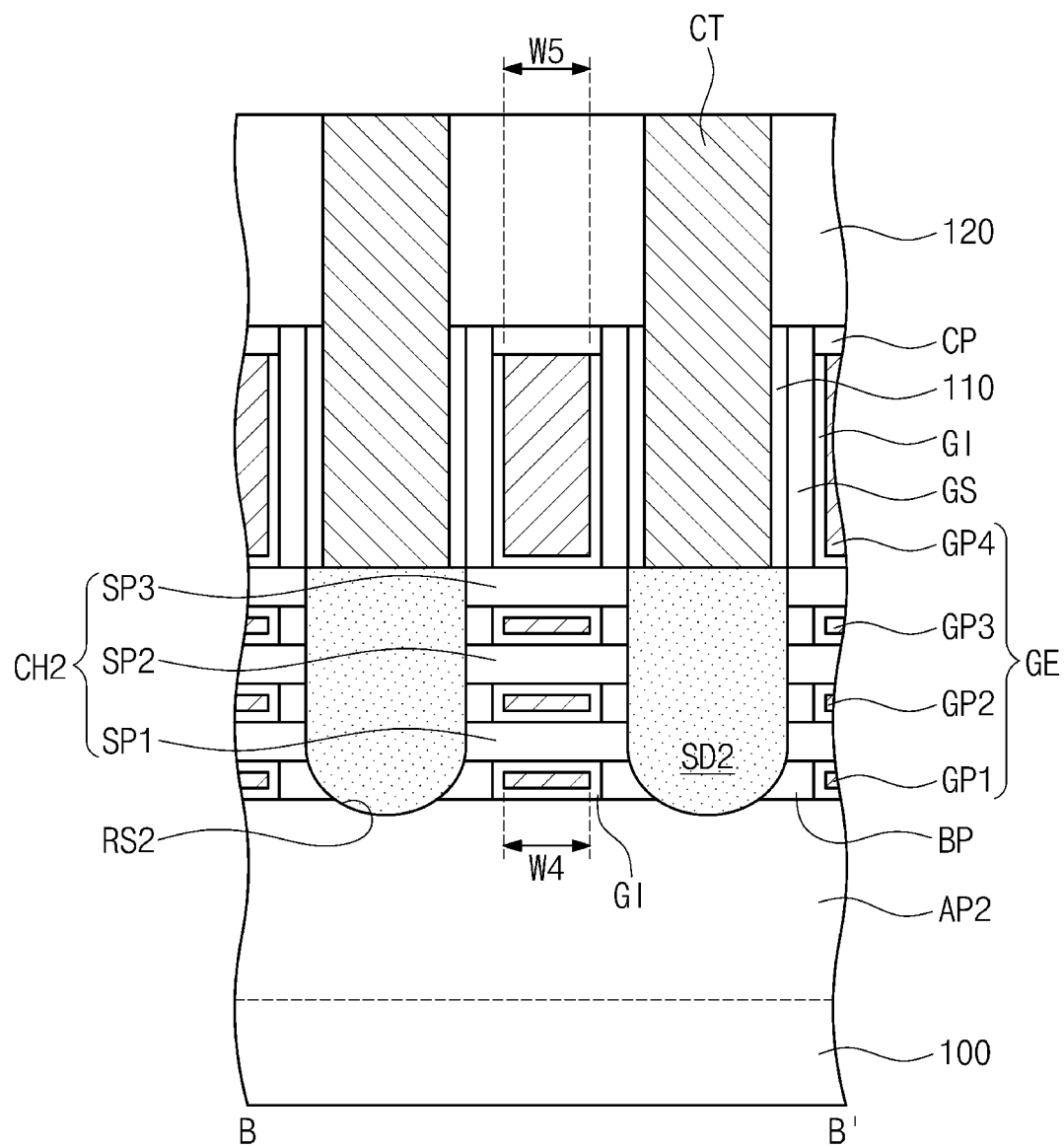
Figure 2B:
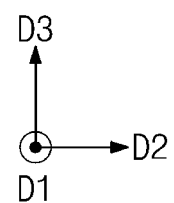
Figure 2C:
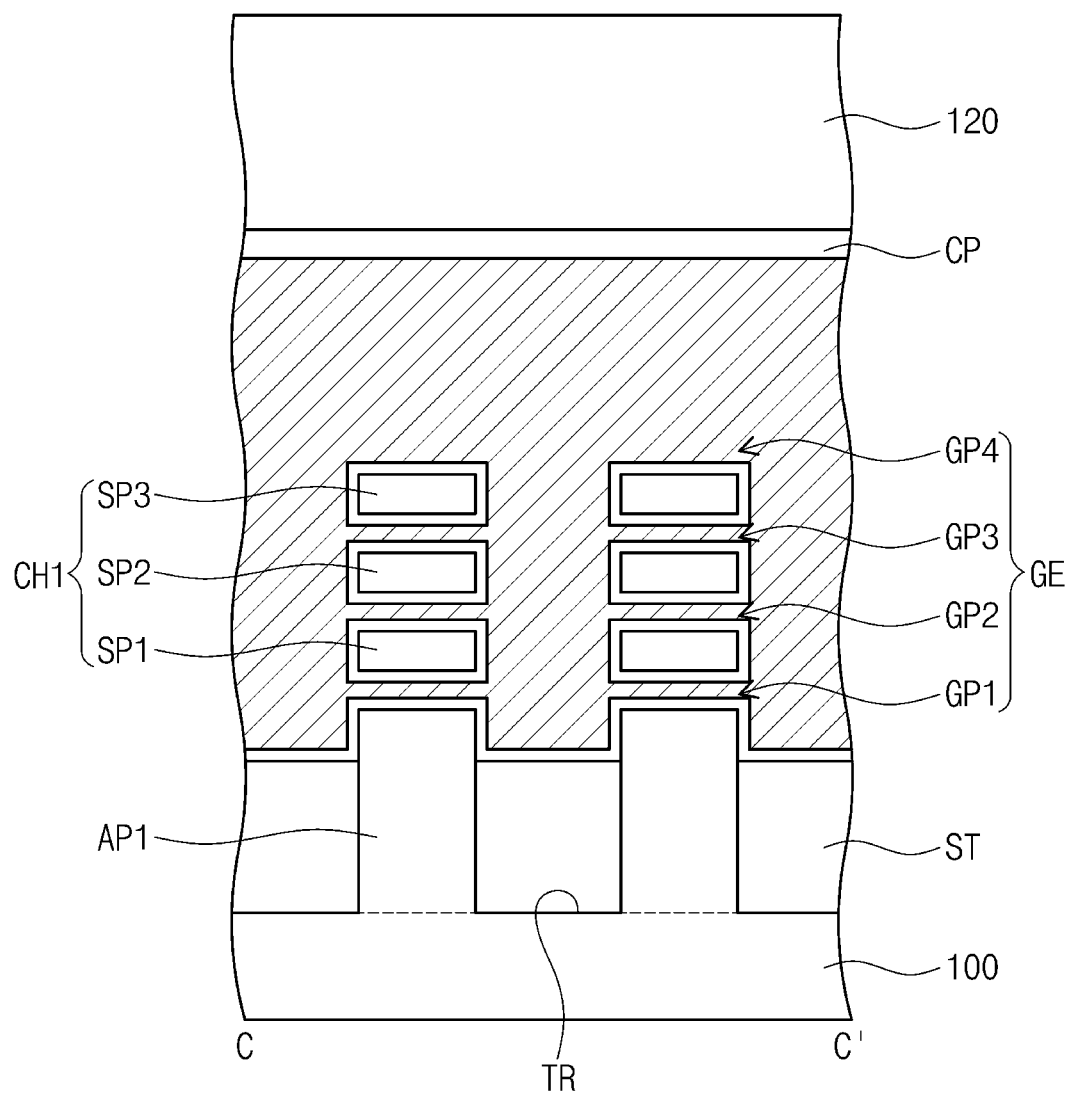
Figure 2C:
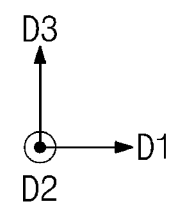
Figure 2D:
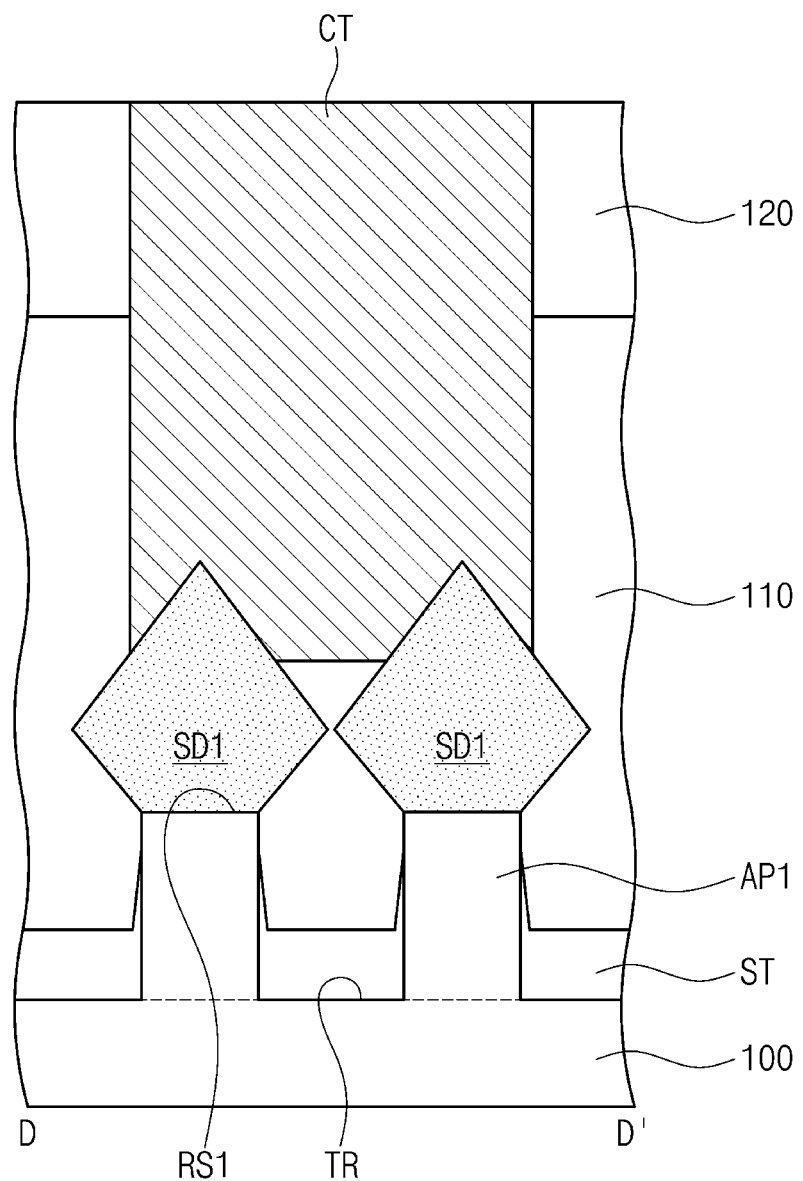
Figure 2D:
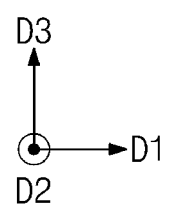
Figure 2E:
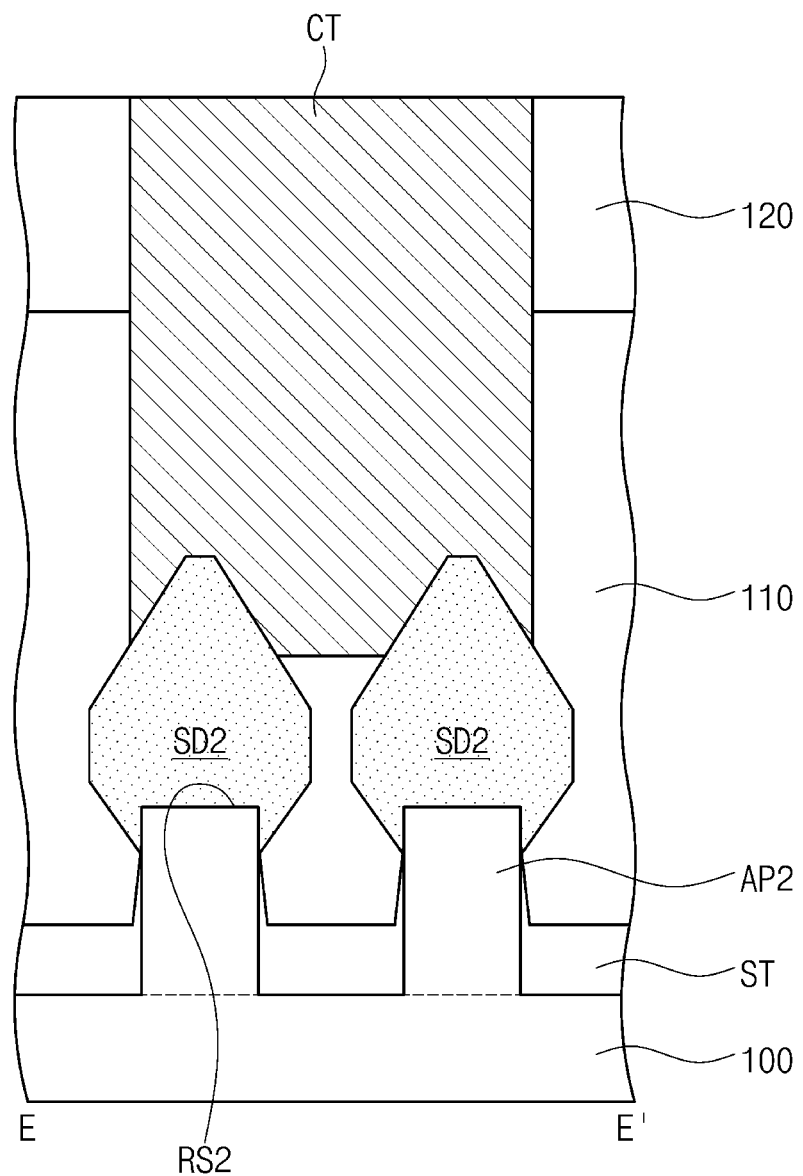
Figure 2E:
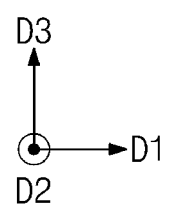

The second transistor on the second region RG2 will be described in more detail with reference to FIG. 2B. The gate electrode GE on the second region RG2 may include the first, second, third, and fourth portions GP1-GP4. The first portion GP1 may be interposed between the second active pattern AP2 and the first semiconductor pattern SP1, the second portion GP2 may be interposed between the first semiconductor pattern SP1 and the second semiconductor pattern SP2, the third portion GP3 may be interposed between the second semiconductor pattern SP2 and the third semiconductor pattern SP3, and the fourth portion GP4 may be provided on the third semiconductor pattern SP3.

Barrier insulating patterns BP may be respectively interposed between the second source/drain pattern SD2 and the first, second, and third portions GP1-GP3 of the gate electrode on the second region RG2. Each of the barrier insulating patterns BP may be configured to separate the gate dielectric pattern GI from the second source/drain pattern SD2. The barrier insulating patterns BP may be formed of or include silicon nitride.

The first, second, and third portions GP1-GP3 of the gate electrode GE on the second region RG2 may be provided to have substantially the same maximum width in the second direction D2. The maximum width of each of the first to third portions GP1-GP3 in the second direction D2 may be a fourth width W4. The maximum width of the fourth portion GP4 of the gate electrode GE on the second region RG2 in the second direction D2 may be a fifth width W5. The fifth width W5 may be substantially equal to the fourth width W4.

The fourth width W4 of each of the first, second, and third portions GP1-GP3 on the second region RG2 may be less than the first width W1 of the first portion GP1 of the gate electrode GE on the first region RG1 described above. The fourth width W4 of each of the first, second, and third portions GP1-GP3 of the gate electrode GE on the second region RG2 may be less than the second width W2 of the second portion GP2 on the first region RG1 described above.

Each of the second source/drain patterns SD2 may be provided to fill a second recess RS2, which is formed in an upper portion of the second active pattern AP2. The second recess RS2 may be defined between adjacent ones of the second channel patterns CH2. A bottom level of the second recess RS2 may be lower than a level of the top surface of the second active pattern AP2.

In the semiconductor device according to some embodiments of the inventive concept, a lower width of each of the first and second source/drain patterns SD1 and SD2 may decrease with decreasing distance from the substrate 100. The bottom surface of each of the first and second source/drain patterns SD1 and SD2 may be adjacent to the top surface of each of the first and second active patterns AP1 and AP2. Thus, in the semiconductor device according to some embodiments of the inventive concept, it may be possible to reduce or minimize a leakage current, which may occur at a lower portion of each of the first and second source/drain patterns SD1 and SD2.

Figure 8A:
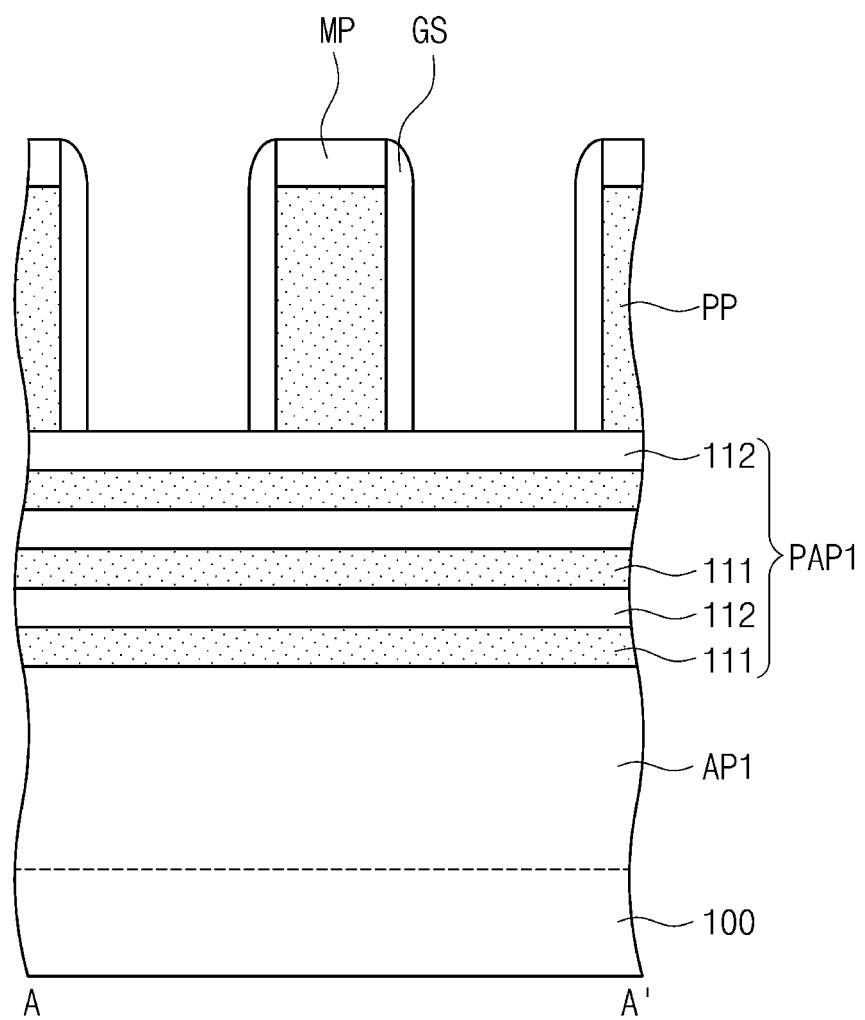
Figure 8A:
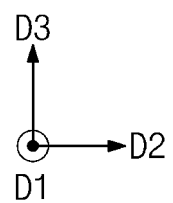
Figure 8B:
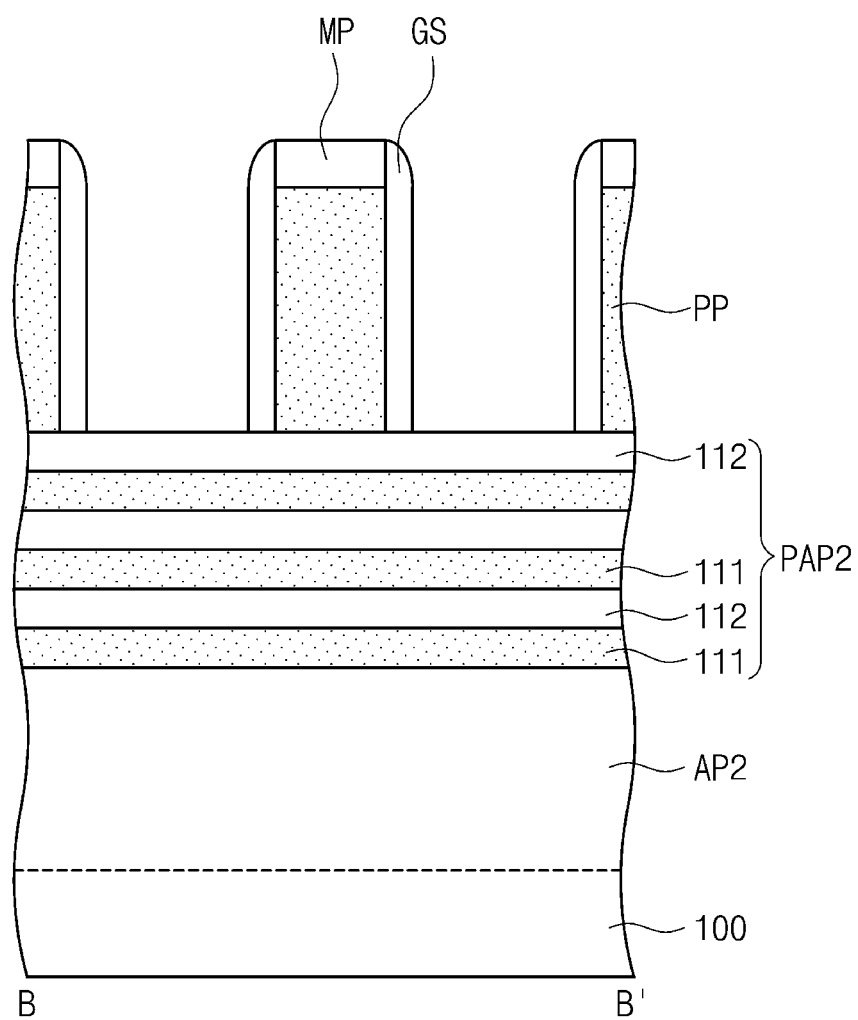
Figure 8B:
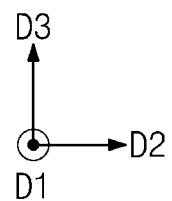
Figure 8C:
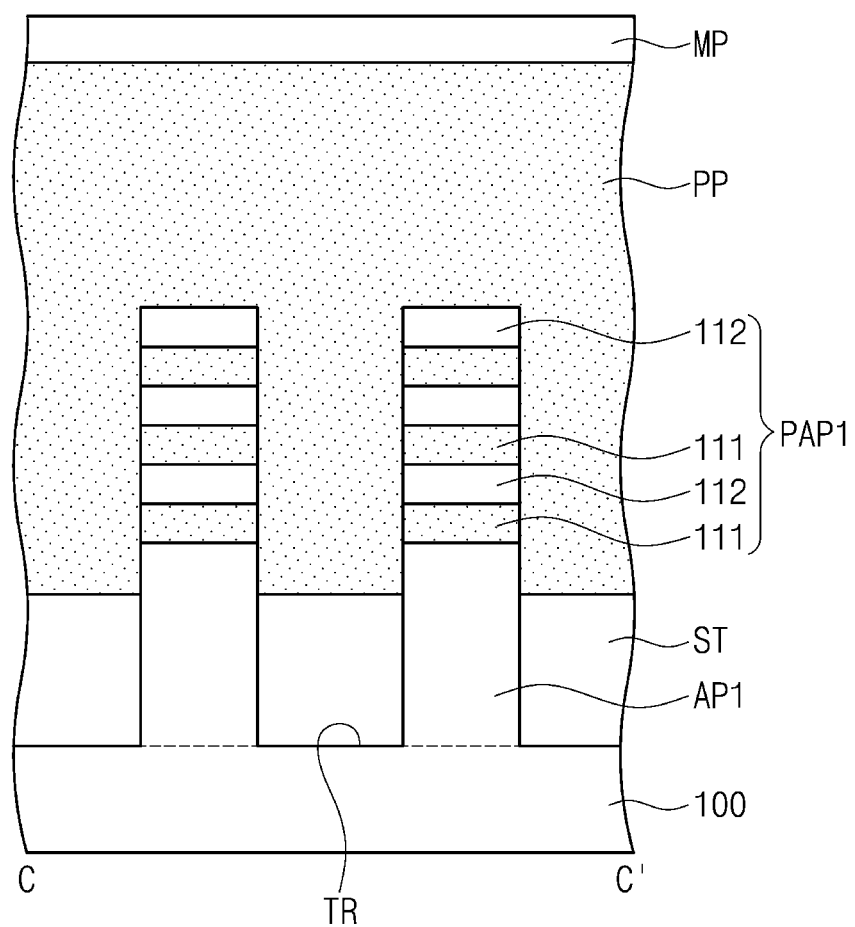
Figure 8C:
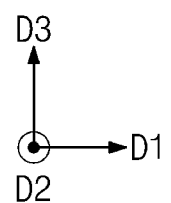
Figure 8D:
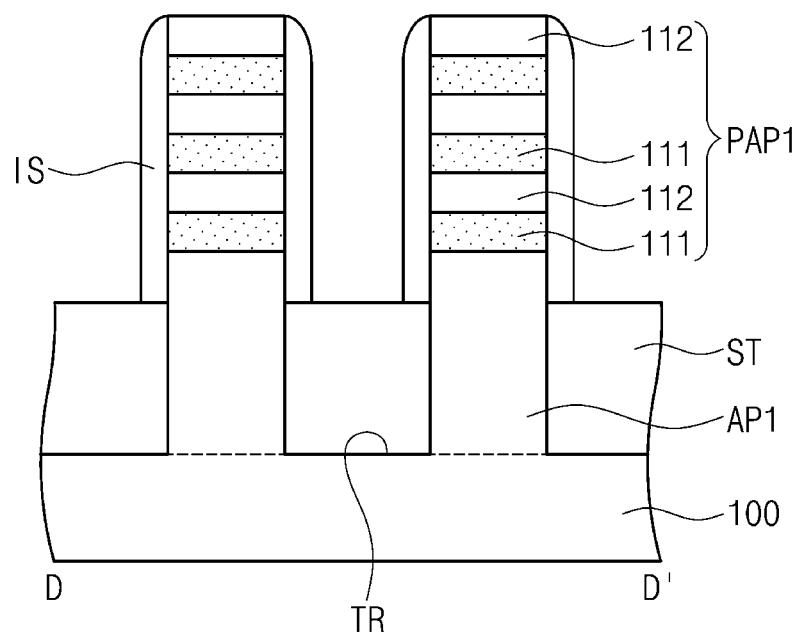
FIGS. 8D, 10D, and 12D are sectional views taken along lines D-D' of FIGS. 7, 9, and 11, respectively.
Figure 8D:
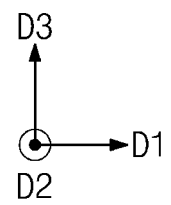
Figure 9:
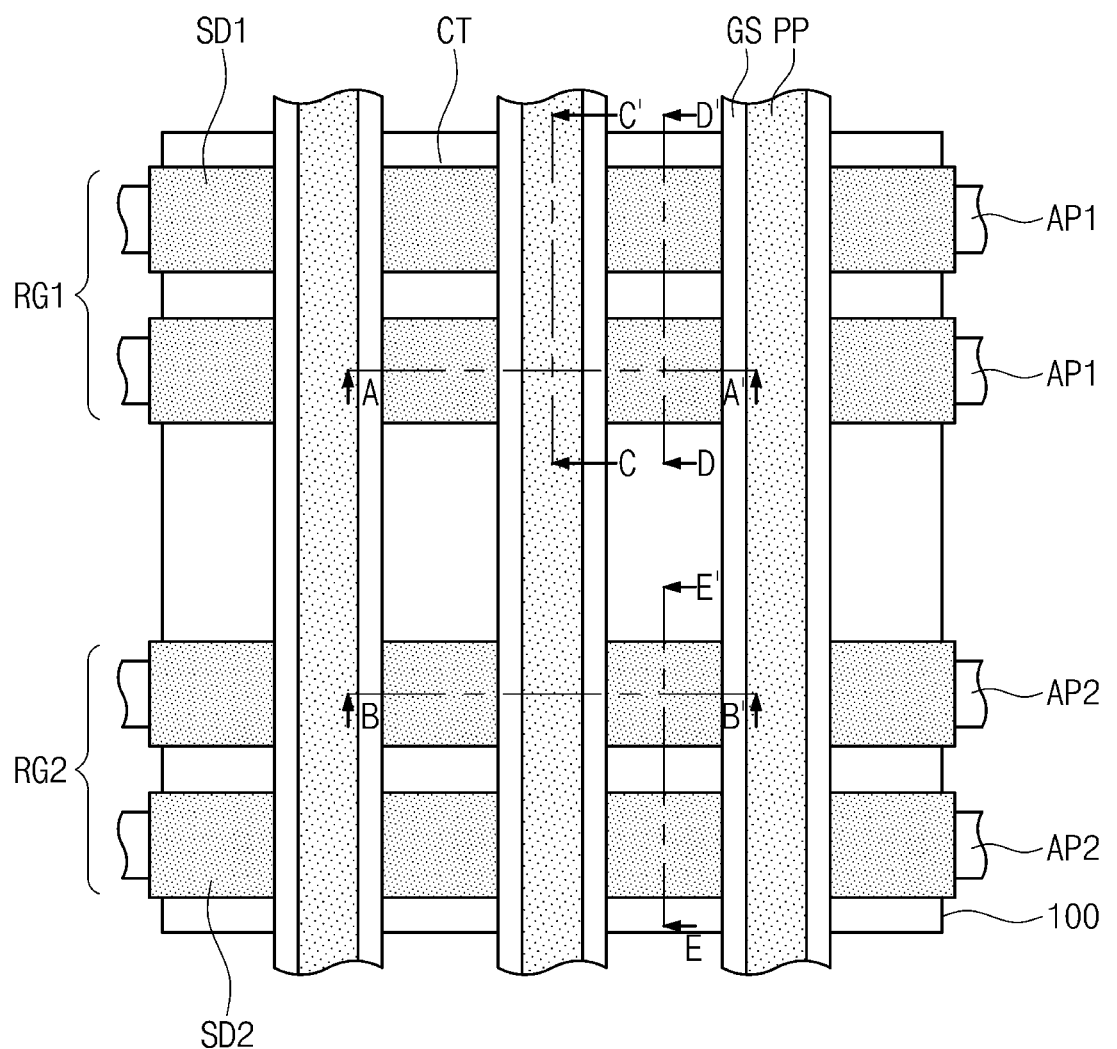
Figure 10A:
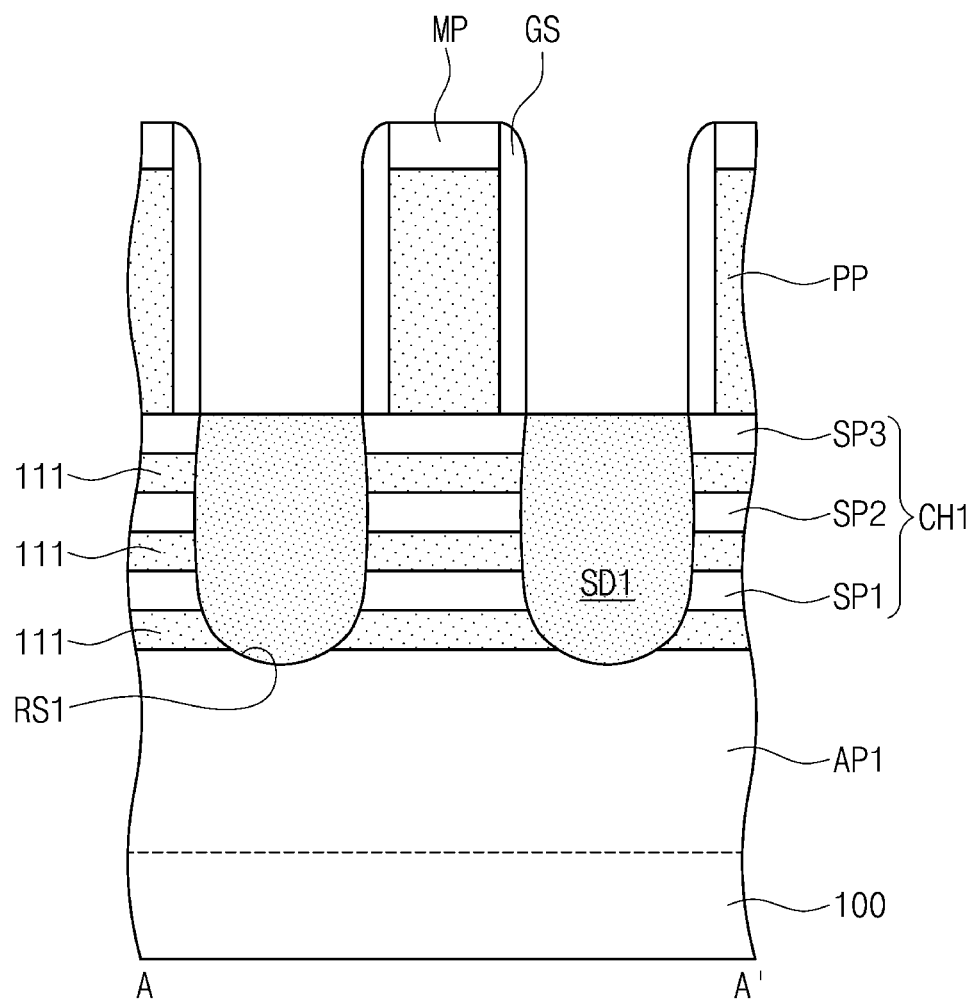
Figure 10A:
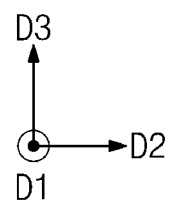
Figure 10B:
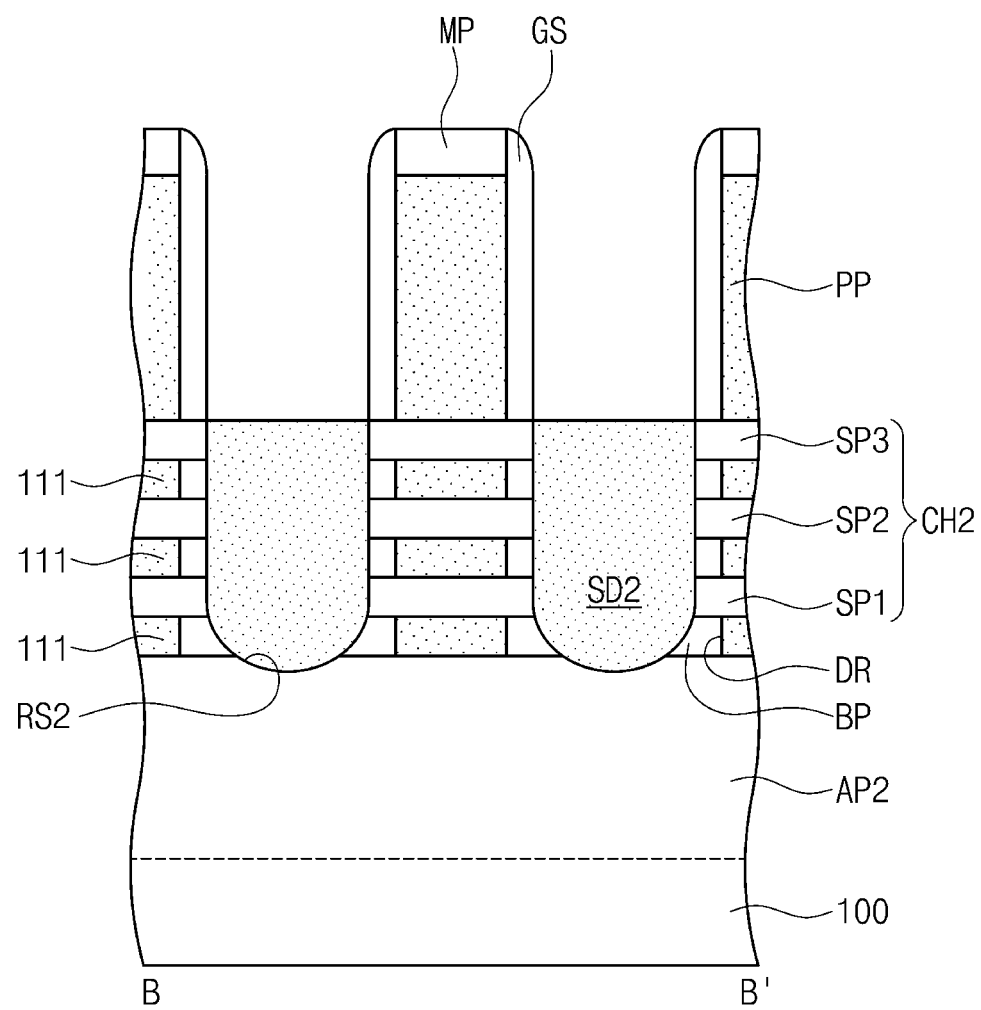
Figure 10B:
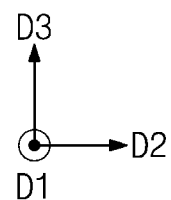
Figure 10C:
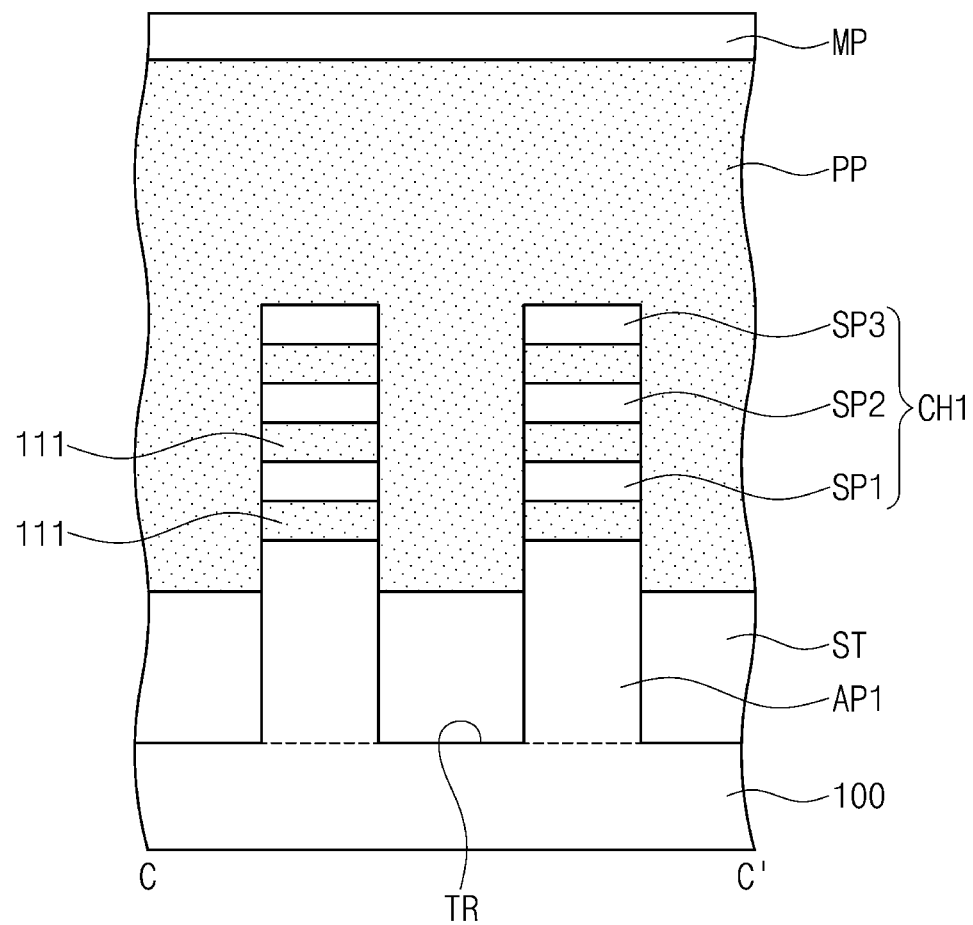
Figure 10C:
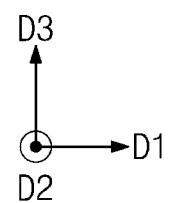
Figure 10D:
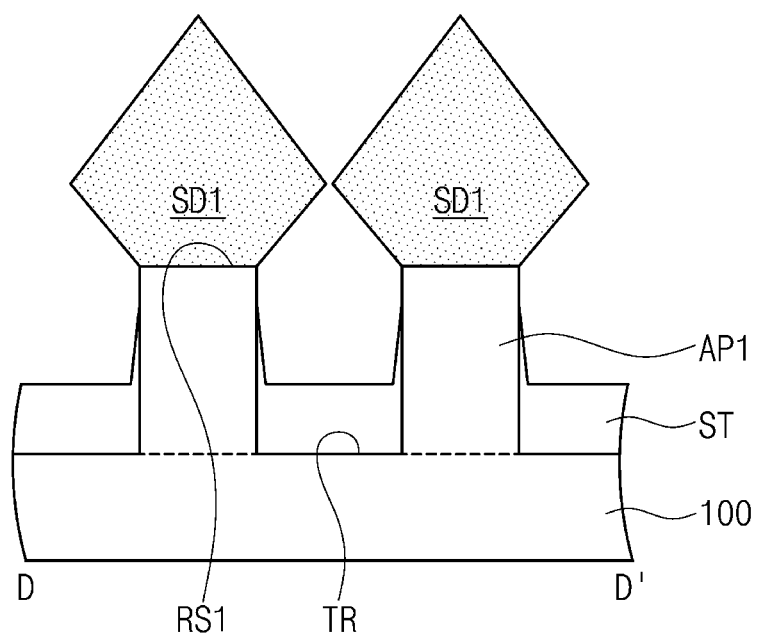
Figure 10D:
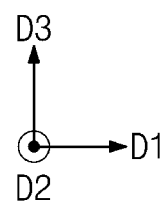
Figure 10E:
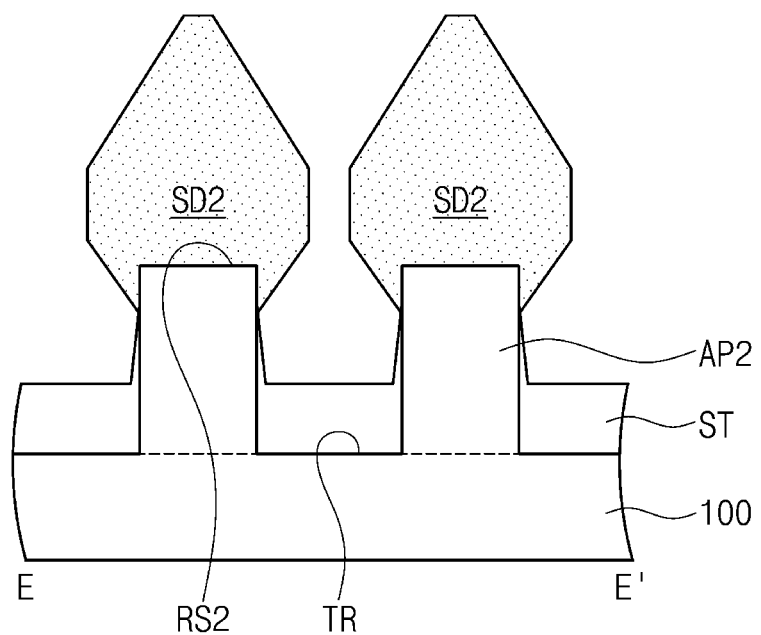
FIGS. 10E and 12E are sectional views taken along lines E-E' of FIGS. 9 and 11, respectively.
Figure 11:
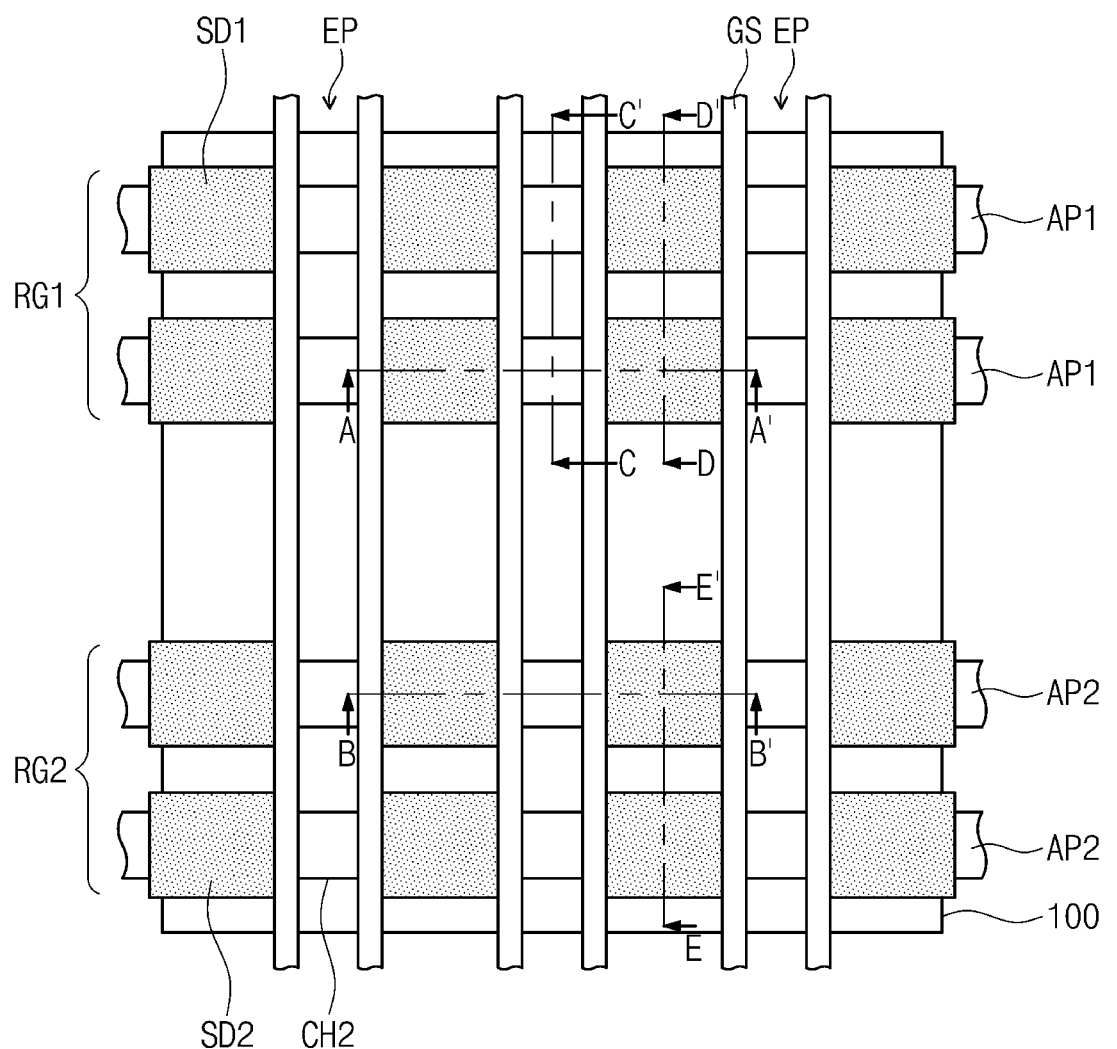
Figure 11:
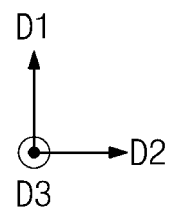
Figure 12A:
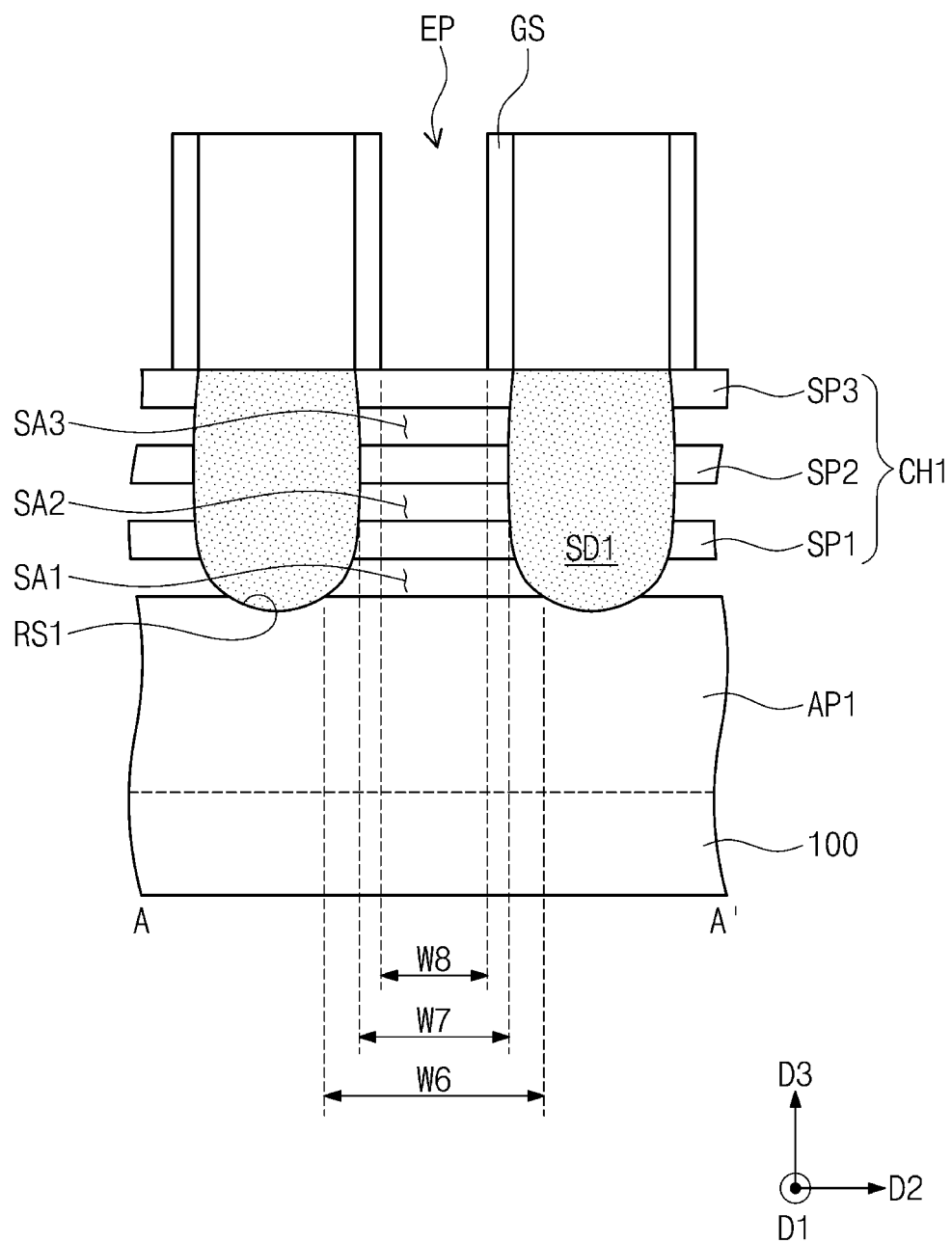
Figure 12B:
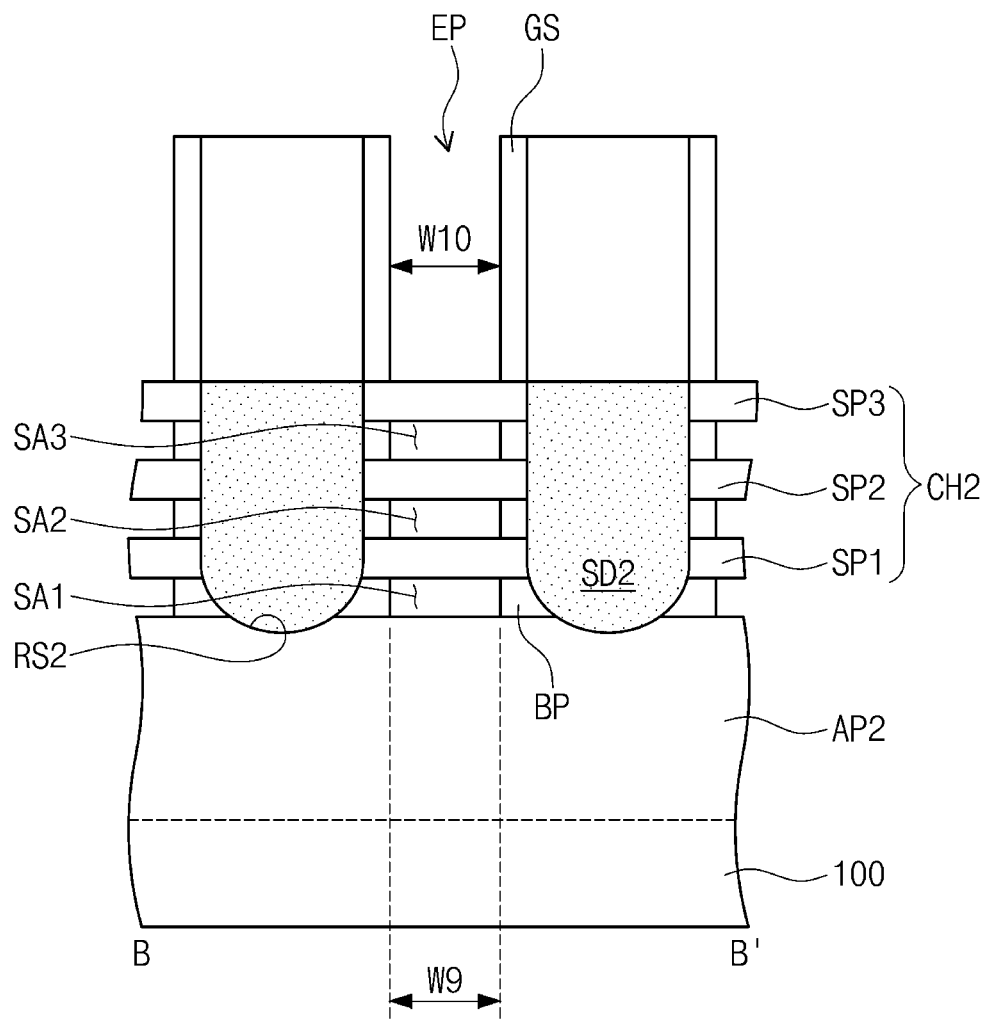
Figure 12C:
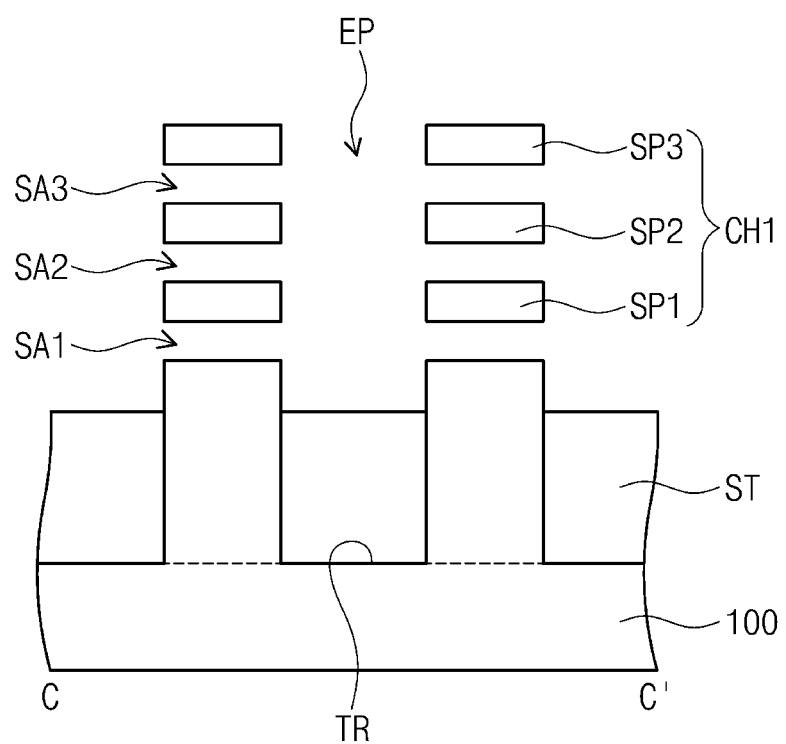
Figure 12D:
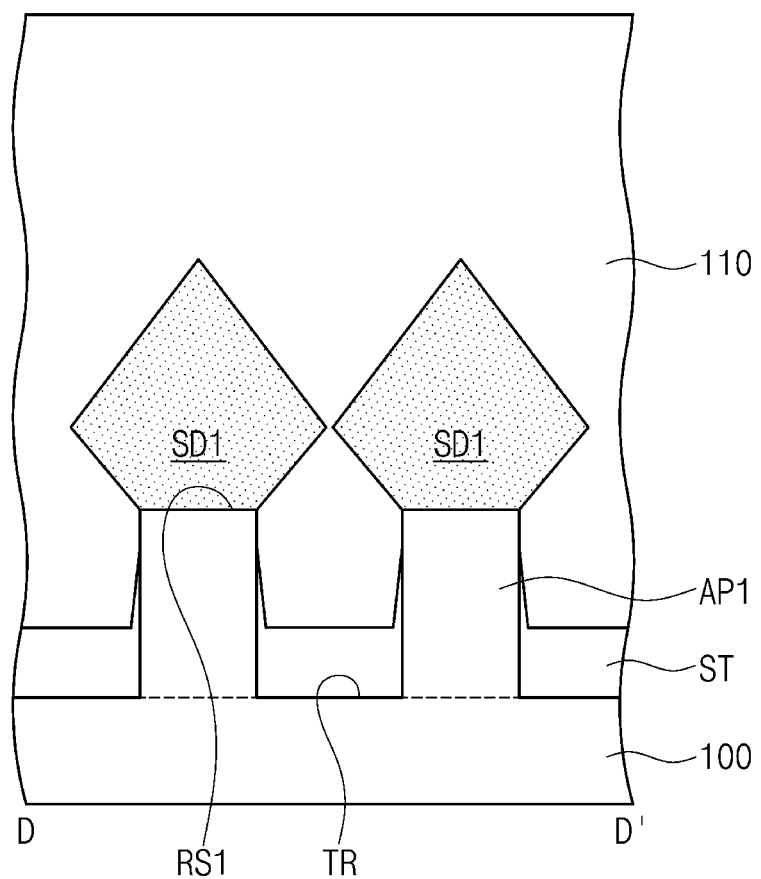
Figure 12E:
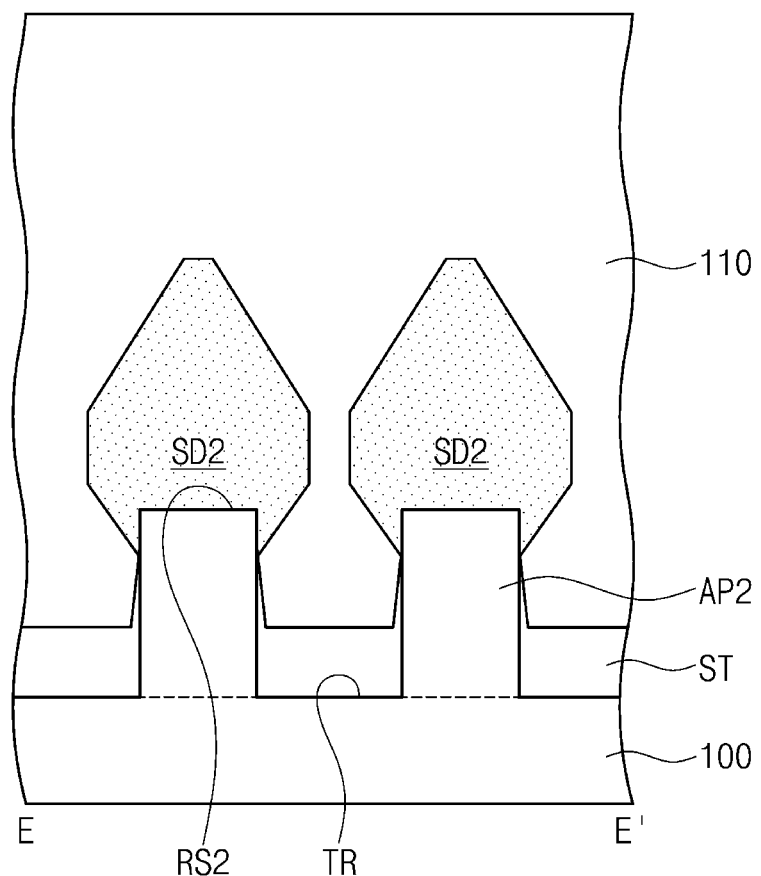

FIGS. 3, 5, 7, 9, and 11 are plan views illustrating a method of fabricating a semiconductor device according to some embodiments of the inventive concept. FIGS. 4, 6A, 8A, 10A, and 12A are sectional views taken along lines A-A' of FIGS. 3, 5, 7, 9, and 11, respectively. FIGS. 6B, 8B, 10B, and 12B are sectional views taken along lines B-B' of FIGS. 5, 7, 9, and 11, respectively. FIGS. 6C, 8C, 10C, and 12C are sectional views taken along lines C-C' of FIGS. 5, 7, 9, and 11, respectively. FIGS. 8D, 10D, and 12D are sectional views taken along lines D-D' of FIGS. 7, 9, and 11, respectively. FIGS. 10E and 12E are sectional views taken along lines E-E' of FIGS. 9 and 11, respectively.

Figure 3:
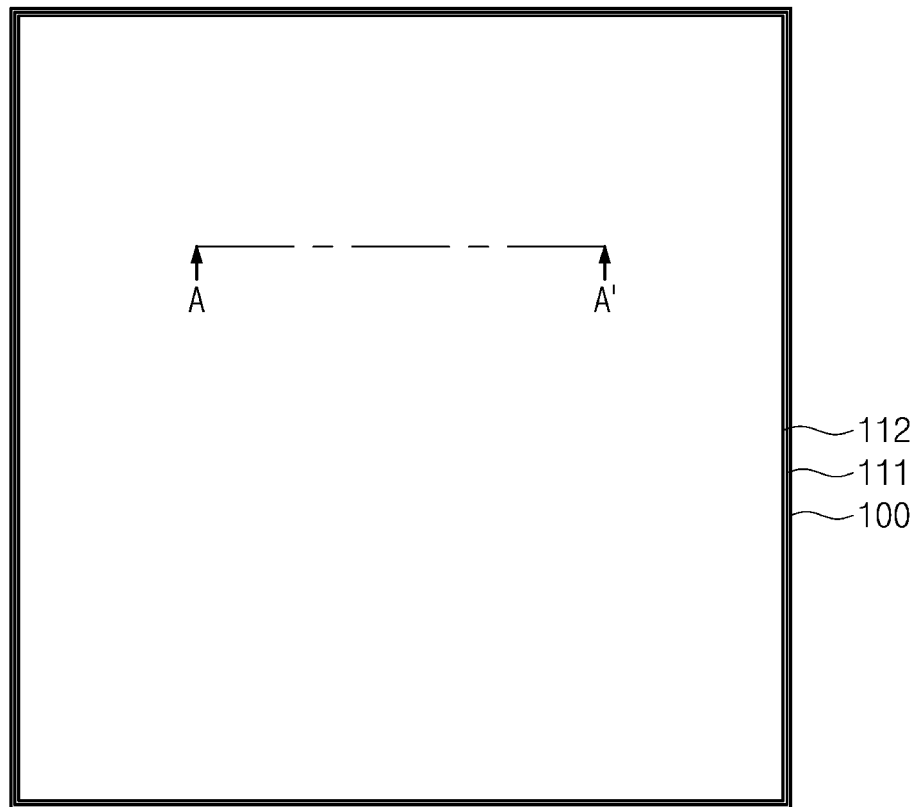
FIGS. 3, 5, 7, 9, and 11 are plan views illustrating a method of fabricating a semiconductor device according to some embodiments of the inventive concept.
Figure 3:
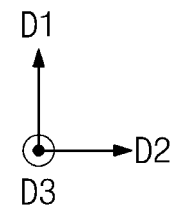
Figure 4:
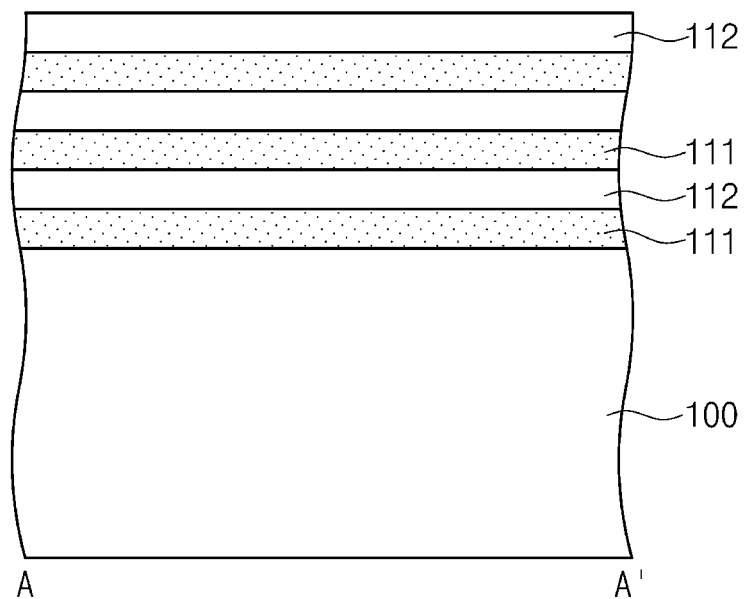
FIGS. 4, 6A, 8A, 10A, and 12A are sectional views taken along lines A-A' of FIGS. 3, 5, 7, 9, and 11, respectively.
Figure 4:
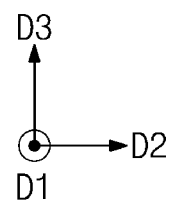
Figure 5:
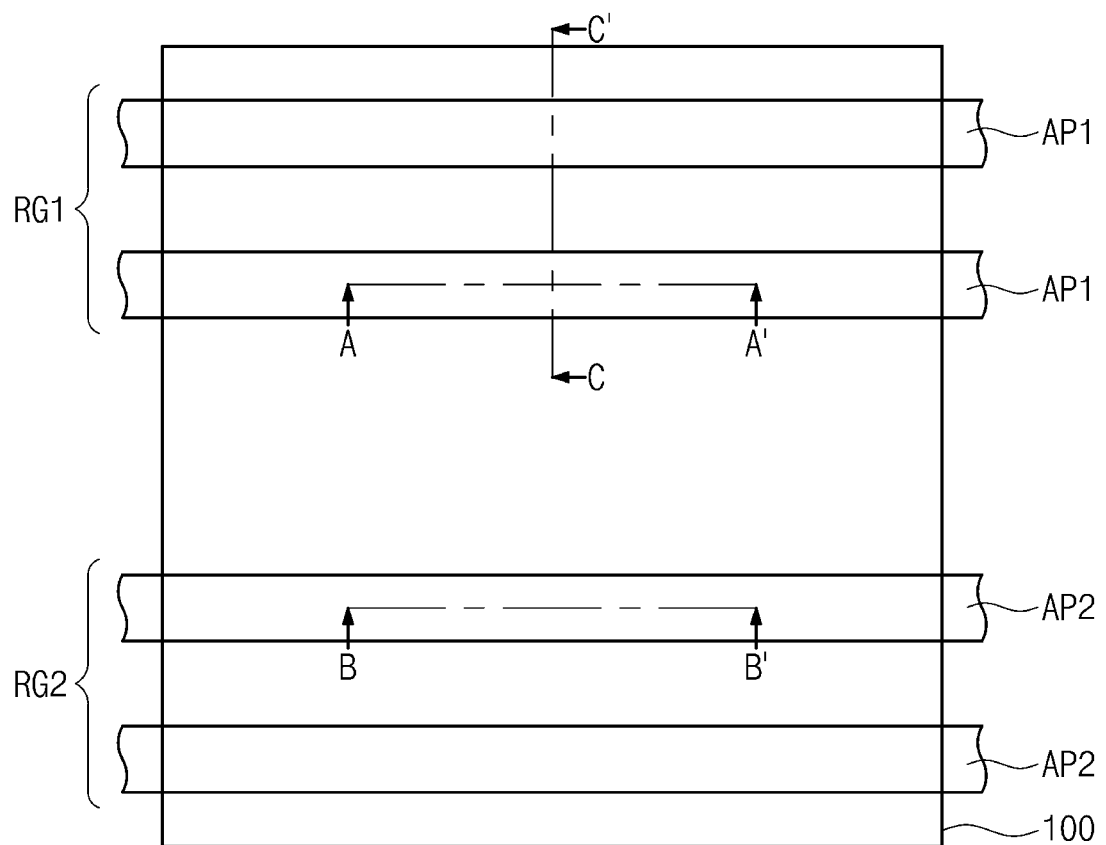
Figure 5:
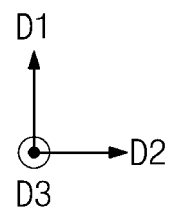
Figure 6A:
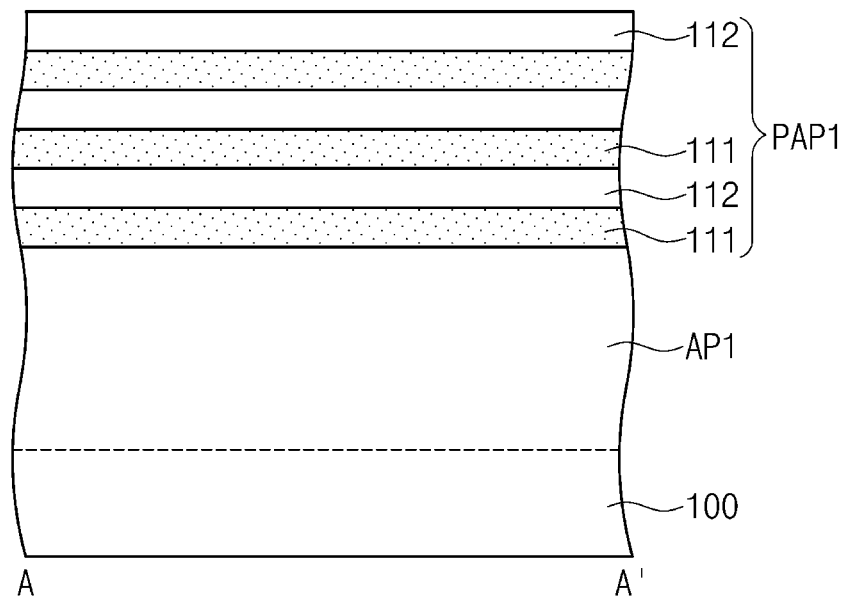
Figure 6A:
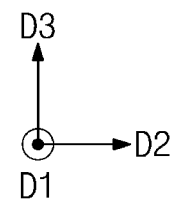
Figure 6B:
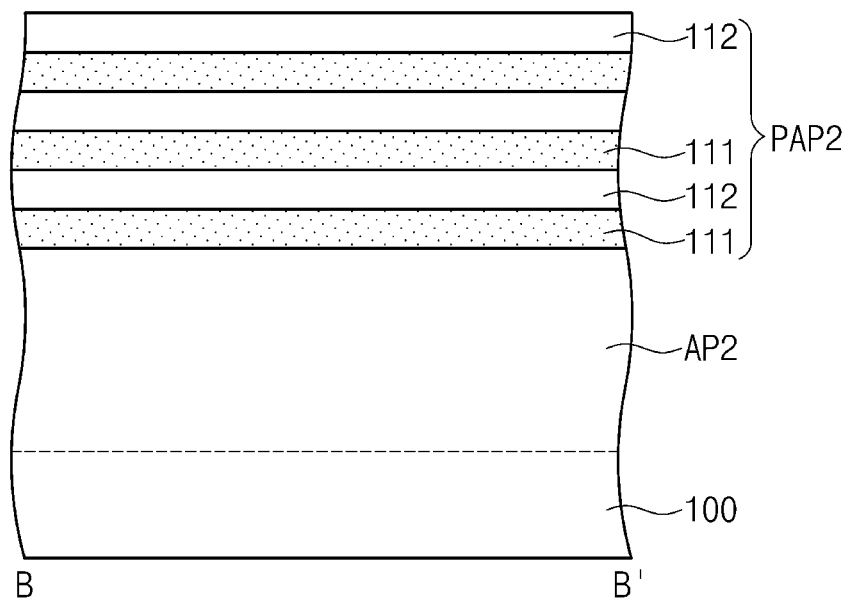
FIGS. 6B, 8B, 10B, and 12B are sectional views taken along lines B-B' of FIGS. 5, 7, 9, and 11, respectively.
Figure 6C:
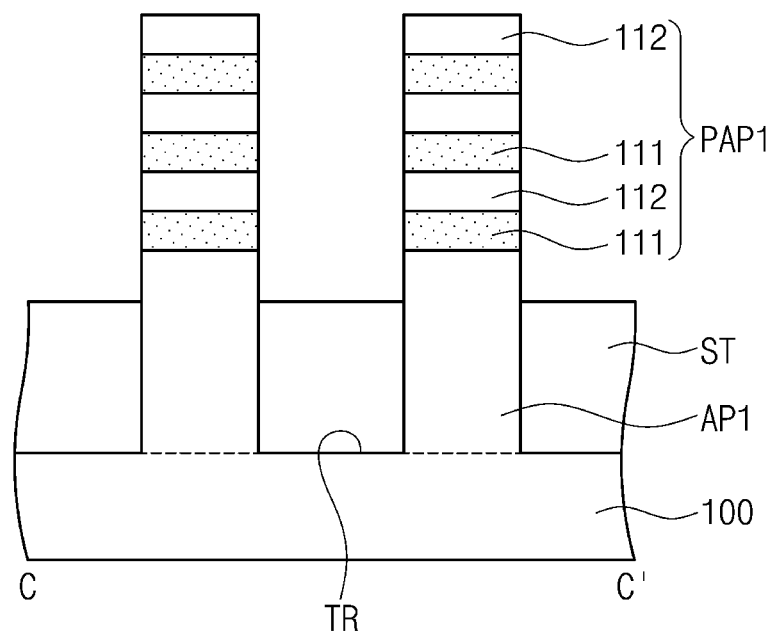
FIGS. 6C, 8C, 10C, and 12C are sectional views taken along lines C-C' of FIGS. 5, 7, 9, and 11, respectively.
Figure 6C:
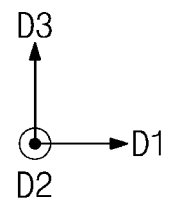
Figure 7:
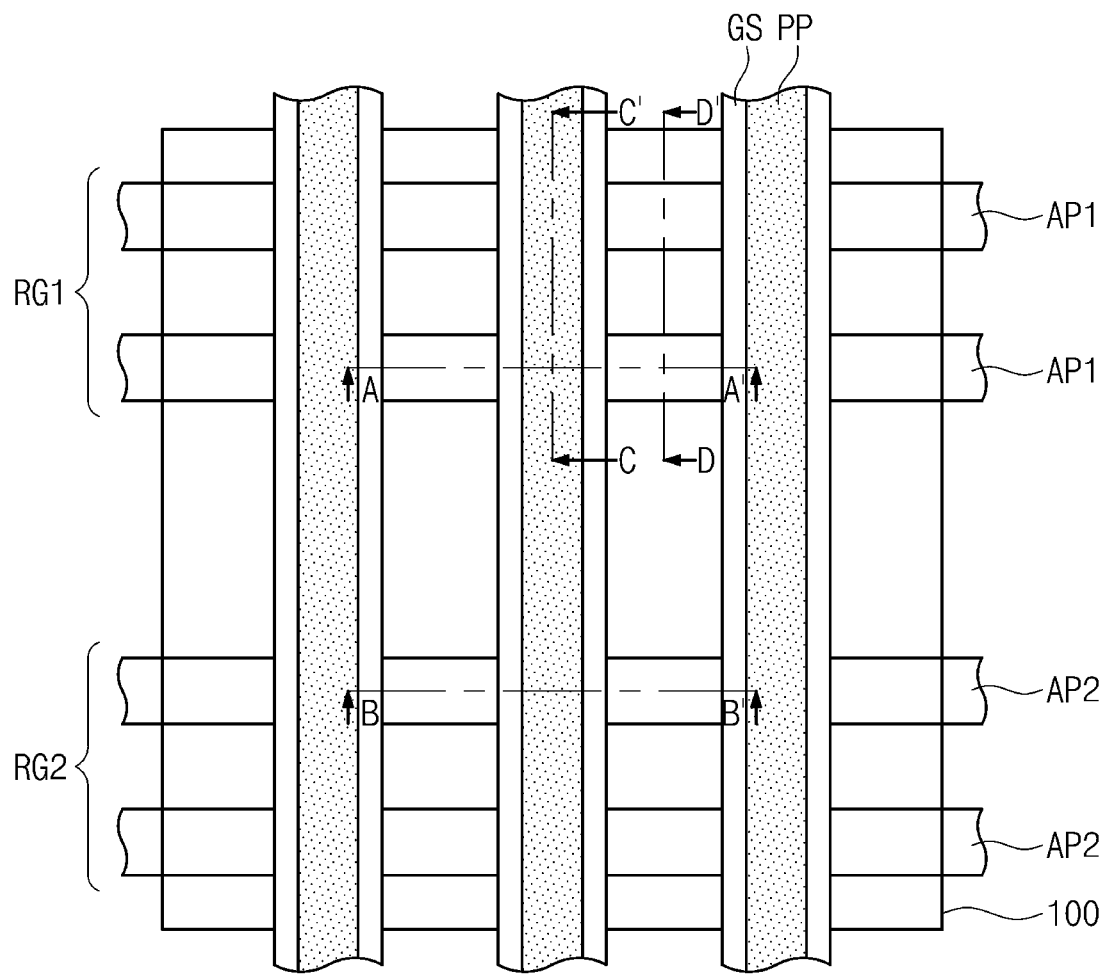
Figure 7:
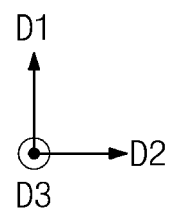

Referring to FIGS. 3 and 4, sacrificial layers 111 and semiconductor layers 112 be alternatingly and repeatedly stacked on the substrate 100. Although FIG. 4 shows an example in which three semiconductor layers 112 are provided on the substrate 100, the inventive concept is not limited thereto. The sacrificial layers 111 may be formed of or include a material having an etch selectivity with respect to the semiconductor layers 112. For example, the semiconductor layers 112 may be formed of or include a material that is not etched in a process for etching the sacrificial layers 111. In some embodiments, in the process of etching the sacrificial layers 111, a ratio in etch rate of the sacrificial layers 111 to the semiconductor layers 112 may range from 10:1 to 200:1. For example, the sacrificial layers 111 may be formed of or include silicon-germanium (SiGe) or germanium (Ge), and the semiconductor layers 112 may be formed of or include silicon (Si).

Each of the sacrificial layers 111 and semiconductor layers 112 may be formed by an epitaxial growth process using the substrate 100 as a seed layer. The sacrificial layers 111 and semiconductor layers 112 may be successively formed in the same chamber. The sacrificial layers 111 and semiconductor layers 112 may be conformally grown on the entire top surface of the substrate 100.

Referring to FIGS. 5 and 6A to 6C, the sacrificial layers 111 and semiconductor layers 112 may be patterned in such a way that first and second preliminary patterns PAP1 and PAP2 are formed on the first and second regions RG1 and RG2, respectively, of the substrate 100. During the patterning process, an upper portion of the substrate 100 may be etched to form trenches TR defining the first and second active patterns AP1 and AP2. The first and second active patterns AP1 and AP2 may be formed on the first and second regions RG1 and RG2, respectively, of the substrate 100.

The first and second preliminary patterns PAP1 and PAP2 may be provided on the first and second active patterns AP1 and AP2, respectively. The first and second preliminary patterns PAP1 and PAP2 may be respectively overlapped with the first and second active patterns AP1 and AP2, when viewed in a plan view. The first and second preliminary patterns PAP1 and PAP2 and the first and second active patterns AP1 and AP2 may be formed to have a line- or bar-shape extending in the second direction D2.

The device isolation layer ST may be formed to fill the trenches TR. The formation of the device isolation layer ST may include forming an insulating layer on the substrate 100 and then recessing the insulating layer to fully expose the first and second preliminary patterns PAP1 and PAP2. For example, the device isolation layer ST may be formed to have a top surface, which is located at a level lower than those of the first and second active patterns AP1 and AP2.

Referring to FIGS. 7 and 8A to 8D, sacrificial patterns PP may be formed to cross the first and second preliminary patterns PAP1 and PAP2. The sacrificial patterns PP may be formed to have a line- or bar-shape extending in the first direction D1.

The formation of the sacrificial patterns PP may include forming a sacrificial layer on the substrate 100, forming mask patterns MP on the sacrificial layer, and etching the sacrificial layer using the mask patterns MP as an etch mask. The sacrificial layer may be formed of or include poly silicon. The mask patterns MP may be formed of or include at least one of silicon oxide, silicon nitride, or silicon oxynitride.

A pair of the gate spacers GS may be formed on both side surfaces of each of the sacrificial patterns PP. A pair of insulating spacers IS may be formed on both side surfaces of each of the first and second preliminary patterns PAP1 and PAP2, as shown in FIG. 8D. The gate spacers GS and the insulating spacers IS may be formed at the same time. For example, the gate spacers GS and the insulating spacers IS may be formed of or include the same material. In some embodiments, the gate spacers GS and the insulating spacers IS may be formed of or include at least one of SiCN, SiCON, or SiN.

The formation of the gate spacers GS and the insulating spacers IS may include forming a spacer layer on the substrate 100 using a deposition process (e.g., CVD or ALD) and performing an anisotropic etching process on the spacer layer.

Referring to FIGS. 9 and 10A to 10E, the first and second channel patterns CH1 and CH2 may be respectively formed by etching the first and second preliminary patterns PAP1 and PAP2 using the mask patterns MP and the gate spacers GS as an etch mask. The semiconductor layers 112 of each of the first and second preliminary patterns PAP1 and PAP2 may be patterned to form the first to third semiconductor patterns SP1, SP2, and SP3. Each of the first and second channel patterns CH1 and CH2 may include the first to third semiconductor patterns SP1, SP2, and SP3.

The first and second preliminary patterns PAP1 and PAP2 may be etched to form the first and second recesses RS1 and RS2, respectively. The insulating spacers IS may be removed, when the first and second preliminary patterns PAP1 and PAP2 are etched. An upper portion of the first active pattern AP1 may be over-etched in such a way that bottom surfaces of the first recesses RS1 are located below the top surface of the first active pattern AP1. An upper portion of the second active pattern AP2 may be over-etched in such a way that bottom surfaces of the second recesses RS2 are located below the top surface of the second active pattern AP2. The first channel pattern CH1 may be located between each adjacent pair of the first recesses RS1, and the second channel pattern CH2 may be located between each adjacent pair of the second recesses RS2.

The sacrificial layers 111 on the second region RG2 may be partially removed to form dent regions DR. The formation of the dent regions DR may include forming a hard mask pattern to locally expose the second region RG2 and isotropically or laterally etching portions of the sacrificial layers 111 exposed by the second recesses RS2. In the case where the first to third semiconductor patterns SP1, SP2, and SP3 include silicon (Si) and the sacrificial layers 111 include silicon-germanium (SiGe), the formation of the dent regions DR may include performing an etching process, in which an etching solution containing peracetic acid is used.

The barrier insulating patterns BP may be formed to fill the dent regions DR. For example, the formation of the barrier insulating patterns BP may include conformally forming a barrier insulating layer to fill the dent regions DR on the second region RG2 and then isotropically and partially etching the barrier insulating layer. In some embodiments, the barrier insulating layer may be formed of or include silicon nitride.

The first source/drain patterns SD1 may be formed to fill the first recesses RS1. The formation of the first source/drain patterns SD1 may include performing a selective epitaxial process, in which the first active pattern AP1 and the first to third semiconductor patterns SP1, SP2, and SP3 on the first active pattern AP1 are used as a seed layer. The first source/drain patterns SD1 may be formed of or include a material capable of exerting a compressive strain on the first channel pattern CH1. As an example, the first source/drain patterns SD1 may be formed of or include a semiconductor material (e.g., SiGe) whose lattice constant is greater than that of a semiconductor material of the substrate 100. During or after the selective epitaxial process, the first source/drain patterns SD1 may be doped with p-type impurities.

The second source/drain patterns SD2 may be formed to fill the second recesses RS2. The formation of the second source/drain patterns SD2 may include performing a selective epitaxial process, in which the second active pattern AP2 and the first to third semiconductor patterns SP1, SP2, and SP3 on the second active pattern AP2 are used as a seed layer. As an example, the second source/drain patterns SD2 may be formed of or include the same semiconductor material (e.g., Si) as the substrate 100. During or after the selective epitaxial process, the second source/drain patterns SD2 may be doped with n-type impurities.

Referring to FIGS. 11 and 12A to 12E, the first interlayered insulating layer 110 may be formed on the substrate 100. Thereafter, a planarization process may be performed on the first interlayered insulating layer 110 to expose top surfaces of the sacrificial patterns PP. The planarization process may include an etch-back process and/or a chemical mechanical polishing (CMP) process. The mask patterns MP may be removed when the planarization process is performed on the first interlayered insulating layer 110. In some embodiments, the first interlayered insulating layer 110 may be formed of or include silicon oxide or silicon oxynitride.

The sacrificial patterns PP exposed by the planarization process may be selectively removed. As a result of the removal of the sacrificial patterns PP, an empty space EP may be formed between each adjacent pair of the gate spacers GS. The empty spaces EP may be formed to expose the first and second channel patterns CH1 and CH2 and the sacrificial layers 111.

The sacrificial layers 111 exposed by the empty spaces EP may be selectively removed. In the case where the sacrificial layers 111 include silicon-germanium (SiGe) and the first to third semiconductor patterns SP1, SP2, and SP3 include silicon (Si), the selective etching process may be performed using an etching solution containing peracetic acid. The etching solution may be prepared to further include hydrofluoric acid (HF) aqueous solution and deionized water. As a result of the selective removal of the sacrificial layers 111, first to third cavities SA1, SA2, and SA3 may be formed. The first to third cavities SA1, SA2, and SA3 may be connected to the empty space EP to expose top, bottom, and side surfaces of each of the first to third semiconductor patterns SP1, SP2, and SP3.

Referring back to FIG. 12A, the first cavity SA1 on the first region RG1 may be defined between the first active pattern AP1 and the first semiconductor pattern SP1, the second cavity SA2 may be defined between the first semiconductor pattern SP1 and the second semiconductor pattern SP2, and the third cavity SA3 may be defined between the second semiconductor pattern SP2 and the third semiconductor pattern SP3.

A width of the first cavity SA1 in the second direction D2 may increase with decreasing distance from the substrate 100. The maximum width of the first cavity SA1 in the second direction D2 may be a sixth width W6. A width of each of the second cavity SA2 and the third cavity SA3 in the second direction D2 may be less than the sixth width W6. For example, the maximum width of the second cavity SA2 in the second direction D2 may be a seventh width W7 that is less than the sixth width W6. The maximum width of the empty space EP in the second direction D2 may be an eighth width W8 that is less than the seventh width W7.

Referring back to FIG. 12B, the first cavity SA1 on the second region RG2 may be defined between the second active pattern AP2 and the first semiconductor pattern SP1, the second cavity SA2 may be defined between the first semiconductor pattern SP1 and the second semiconductor pattern SP2, and the third cavity SA3 may be defined between the second semiconductor pattern SP2 and the third semiconductor pattern SP3.

The first to third cavities SA1, SA2, and SA3 in the second direction D2 may be formed to have substantially the same maximum width. The maximum width of each of the first to third cavities SA1, SA2, and SA3 in the second direction D2 may be a ninth width W9. The maximum width of the empty space EP in the second direction D2 may be a tenth width W10. The tenth width W10 may be substantially equal to the ninth width W9.

Referring back to FIGS. 1 and 2A to 2E, the gate dielectric pattern GI and the gate electrode GE may be formed in each of the empty spaces EP. The formation of the gate dielectric pattern GI and the gate electrode GE may include conformally forming a gate dielectric layer on the empty space EP and the first to third cavities SA1, SA2, and SA3 and then forming a gate electrode layer to completely fill the empty space EP and the first to third cavities SA1, SA2, and SA3 covered with the gate dielectric layer. Portions of the gate electrode layer filling the first to third cavities SA1, SA2, and SA3 may be used as the first to third portions GP1-GP3, respectively, of the gate electrode GE. A portion of the gate electrode layer filling the empty space EP may be used as the fourth portion GP4 of the gate electrode GE. The gate dielectric layer may be formed of or include at least one of high-k dielectric materials. The gate electrode layer may be formed of or include at least one of conductive metal nitrides or metallic materials.

The gate capping patterns CP may be formed on the gate electrodes GE. The gate capping patterns CP may be formed of or include at least one of SiON, SiCN, SiCON, or SiN. The second interlayered insulating layer 120 may be formed on the first interlayered insulating layer 110 and the gate capping patterns CP. The contacts CT may be formed to penetrate the first and second interlayered insulating layers 110 and 120 and to be connected to the first and second source/drain patterns SD1 and SD2.

According to some embodiments of the inventive concept, a semiconductor device may be configured to reduce a leakage current, which may occur at a lower portion of each of source/drain patterns. This may make it possible to improve electric characteristics of the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
   a substrate;
   a channel pattern on the substrate, the channel pattern including a first semiconductor pattern, a second semiconductor pattern and a third semiconductor pattern sequentially stacked on the substrate;
   a source/drain pattern on the substrate and connected to the channel pattern; and
   a gate electrode on the channel pattern, the gate electrode including a first portion between the substrate and the first semiconductor pattern, a second portion between the first semiconductor pattern and the second semiconductor pattern, and a third portion between the second semiconductor pattern and the third semiconductor pattern,
   wherein the first portion includes a first sidewall facing the source/drain pattern,
   wherein the third portion includes a second sidewall facing the source/drain pattern, and
   wherein one of the first and second sidewalls has a positive slope and the other has a negative slope.

2. The semiconductor device of claim 1, further comprising a gate dielectric layer between the gate electrode and the channel pattern,
   wherein gate dielectric layer includes a first gate dielectric pattern between the source/drain pattern and the first portion, a second gate dielectric pattern between the source/drain pattern and the second portion, and a third gate dielectric pattern between the source/drain pattern and the third portion,
   wherein the first gate dielectric pattern includes a third sidewall in contact with the source/drain pattern,
   wherein the third gate dielectric pattern includes a fourth sidewall in contact with the source/drain pattern, and
   wherein one of the third and fourth sidewalls has a positive slope and the other has a negative slope.

3. The semiconductor device of claim 1, wherein a maximum width of the first portion is greater than a maximum width of the second portion,
   wherein the maximum width of the first portion is greater than a maximum width of the third portion, and
   wherein the maximum width of the second portion is different from the maximum width of the third portion.

4. The semiconductor device of claim 1, wherein the source/drain pattern includes a lower portion in contact with the substrate and adjacent to the first portion,
   wherein a width of the lower portion decreases with decreasing distance from a bottom surface of the substrate.

5. The semiconductor device of claim 4, wherein an interface between the lower portion and the substrate has a rounded shape.

6. The semiconductor device of claim 1, wherein the first sidewall has the positive slope, such that a first length of a bottom of the first portion is greater than a second length of a top of the first portion, and
   wherein the second sidewall has the negative slope, such that a third length of a bottom of the third portion is smaller than a fourth length of a top of the third portion.

7. The semiconductor device of claim 1, wherein the channel pattern, the source/drain pattern and the gate electrode are on a PMOSFET region of the substrate.

8. A semiconductor device, comprising:
a substrate;
a channel pattern on the substrate, the channel pattern including a first semiconductor pattern, a second semiconductor pattern and a third semiconductor pattern sequentially stacked on the substrate;
a first source/drain pattern and a second source/drain pattern that are on the substrate, the channel pattern being between the first and second source/drain patterns;
a gate electrode on the channel pattern, the gate electrode including a first portion between the substrate and the first semiconductor pattern, a second portion between the first semiconductor pattern and the second semiconductor pattern, and a third portion between the second semiconductor pattern and the third semiconductor pattern;
a first barrier insulating pattern between the first portion and the first source/drain pattern; and
a second barrier insulating pattern between the first portion and the second source/drain pattern,
wherein the first barrier insulating pattern includes a first sidewall in contact with the first source/drain pattern,
wherein the second barrier insulating pattern includes a second sidewall in contact with the second source/drain pattern, and
wherein a first distance between the first sidewall and the second sidewall increases with decreasing distance from a bottom surface of the substrate.

9. The semiconductor device of claim 8, further comprising
a third barrier insulating pattern between the third portion and the first source/drain pattern; and
a fourth barrier insulating pattern between the third portion and the second source/drain pattern,
wherein the third barrier insulating pattern includes a third sidewall in contact with the first source/drain pattern,
wherein the fourth barrier insulating pattern includes a fourth sidewall in contact with the second source/drain pattern, and
wherein a second distance between the third sidewall and the fourth sidewall is smaller than the first distance.

10. The semiconductor device of claim 8, wherein a second distance between the first and second source/drain patterns measured at a level where the first portion is located is greater than a third distance between the first and second source/drain patterns measured at a level where the third portion is located.

11. The semiconductor device of claim 8, wherein the first source/drain pattern includes a lower portion in contact with the substrate and adjacent to the first portion,
wherein a width of the lower portion decreases with decreasing distance from the bottom surface of the substrate.

12. The semiconductor device of claim 11, wherein an interface between the lower portion and the substrate has a rounded shape.

13. The semiconductor device of claim 8, wherein a first length of a bottom of the first barrier pattern is greater than a second length of a top of the first barrier pattern.

14. The semiconductor device of claim 13, wherein the bottom of the first barrier pattern is in contact with the substrate, and
wherein the top of the first barrier pattern is in contact with the first semiconductor pattern.

15. The semiconductor device of claim 8, further comprising a gate dielectric layer between the gate electrode and the channel pattern,
wherein the gate dielectric layer includes a first gate dielectric pattern between the first barrier insulating pattern and the first portion, and
wherein the gate dielectric layer includes a second gate dielectric pattern between the second barrier insulating pattern and the first portion.

16. The semiconductor device of claim 8, wherein the channel pattern, the first and second source/drain patterns and the gate electrode are on a NMOSFET region of the substrate.

17. A semiconductor device, comprising:
a substrate including a PMOSFET region;
a channel pattern on the PMOSFET region, the channel pattern including a first semiconductor pattern, a second semiconductor pattern and a third semiconductor pattern sequentially stacked on the substrate;
a source/drain pattern on the PMOSFET region and connected to the channel pattern; and
a gate electrode on the channel pattern, the gate electrode including a first portion between the substrate and the first semiconductor pattern, a second portion between the first semiconductor pattern and the second semiconductor pattern, and a third portion between the second semiconductor pattern and the third semiconductor pattern,
wherein a width of the first portion increases with decreasing distance from a bottom surface of the substrate.

18. The semiconductor device of claim 17, wherein a maximum width of the first portion is greater than a maximum width of the second portion,
wherein the maximum width of the first portion is greater than a maximum width of the third portion, and
wherein the maximum width of the second portion is different from the maximum width of the third portion.

19. The semiconductor device of claim 17, wherein a width of the third portion decreases with decreasing distance from the bottom surface of the substrate.

20. The semiconductor device of claim 17, wherein the source/drain pattern includes a lower portion in contact with the substrate and adjacent to the first portion, and
wherein an interface between the lower portion and the substrate has a rounded shape, such that a width of the lower portion decreases with decreasing distance from the bottom surface of the substrate.

* * * * *